United States Patent
Archer et al.

(10) Patent No.: US 10,326,033 B2
(45) Date of Patent: Jun. 18, 2019

(54) PHOTOVOLTAIC DEVICE

(71) Applicant: Alta Devices, Inc., Sunnyvale, CA (US)

(72) Inventors: Melissa J. Archer, San Jose, CA (US); Thomas J. Gmitter, Sunnyvale, CA (US); Gang He, Cupertino, CA (US); Gregg Higashi, San Jose, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 124 days.

(21) Appl. No.: 13/772,043

(22) Filed: Feb. 20, 2013

(65) Prior Publication Data
US 2013/0153013 A1 Jun. 20, 2013

Related U.S. Application Data

(63) Continuation of application No. 12/605,108, filed on Oct. 23, 2009, now Pat. No. 8,937,244.

(Continued)

(51) Int. Cl.
*H01L 31/00* (2006.01)
*H01L 31/0304* (2006.01)
(Continued)

(52) U.S. Cl.
CPC ...... *H01L 31/0304* (2013.01); *H01L 31/0236* (2013.01); *H01L 31/02363* (2013.01);
(Continued)

(58) Field of Classification Search
CPC ....... H01L 31/022441; H01L 31/02327; H01L 31/0304; H01L 31/03046; H01L 31/056;
(Continued)

(56) References Cited

U.S. PATENT DOCUMENTS 3,615,853 A 10/1971 Paine et al.
3,988,167 A * 10/1976 Kressel .......... H01L 31/022425
  136/256
(Continued)

FOREIGN PATENT DOCUMENTS

EP 0595634 A1 5/1994
JP 63-211775 9/1988
(Continued)

OTHER PUBLICATIONS

M. M. Sanfacon et al, "Analysis of AlGaAs/GaAs Solar Cell Structures by Optical Reflectance Spectroscopy" IEEE Transactions on Electron Devices, vol. 37, No. 2, Feb. 1990, pp. 450-454.

(Continued)

*Primary Examiner* — Lindsey A Bernier
(74) *Attorney, Agent, or Firm* — Arent Fox, LLP

(57) ABSTRACT

Methods and apparatus are provided for converting electromagnetic radiation, such as solar energy, into electric energy with increased efficiency when compared to conventional solar cells. One embodiment of the present invention provides a photovoltaic (PV) device. The PV device comprises an absorber layer made of a compound semiconductor; and an emitter layer located closer than the absorber layer to a first side of the device. The PV device includes a p-n junction formed between the emitter layer and the absorber layer, the p-n junction causing a voltage to be generated in the device in response to the device being exposed to light at a second side of the device. Such innovations may allow for greater efficiency and flexibility in PV devices when compared to conventional solar cells.

30 Claims, 18 Drawing Sheets

Related U.S. Application Data

(60) Provisional application No. 61/107,954, filed on Oct. 23, 2008.

(51) Int. Cl.
*H01L 31/068* (2012.01)
*H01L 31/0224* (2006.01)
*H01L 31/065* (2012.01)
*H01L 31/0693* (2012.01)
*H01L 31/0236* (2006.01)
*H01L 31/0735* (2012.01)

(52) U.S. Cl.
CPC ........... *H01L 31/022441* (2013.01); *H01L 31/03046* (2013.01); *H01L 31/065* (2013.01); *H01L 31/0682* (2013.01); *H01L 31/0693* (2013.01); *H01L 31/0735* (2013.01); *Y02E 10/50* (2013.01); *Y02E 10/544* (2013.01)

(58) Field of Classification Search
CPC ........... H01L 31/065; H01L 31/0682; H01L 31/0693; H01L 31/0735; Y02E 10/50; Y02E 10/544
USPC .................. 136/244, 252, 255, 256, 262
See application file for complete search history.

(56) References Cited

U.S. PATENT DOCUMENTS

| | | | |
|---|---|---|---|
| 3,990,101 A * | 11/1976 | Ettenberg et al. | 136/255 |
| 4,015,280 A * | 3/1977 | Matsushita et al. | 136/255 |
| 4,017,332 A * | 4/1977 | James | 136/246 |
| 4,094,704 A * | 6/1978 | Milnes | 136/244 |
| 4,107,723 A | 8/1978 | Kamath | |
| 4,191,593 A | 3/1980 | Cacheux | |
| 4,197,141 A | 4/1980 | Bozler et al. | |
| 4,295,002 A * | 10/1981 | Chappell et al. | 136/244 |
| 4,338,480 A | 7/1982 | Antypas et al. | |
| 4,385,198 A | 5/1983 | Rahilly | |
| 4,400,221 A | 8/1983 | Rahilly | |
| 4,410,758 A | 10/1983 | Grolitzer | |
| 4,419,533 A | 12/1983 | Czubatyj et al. | |
| 4,444,992 A | 4/1984 | Cox, III | |
| 4,479,027 A | 10/1984 | Todorof | |
| 4,497,974 A | 2/1985 | Deckman et al. | |
| 4,543,441 A | 9/1985 | Kumada et al. | |
| 4,571,448 A | 2/1986 | Barnett | |
| 4,582,952 A * | 4/1986 | McNeely | H01L 31/03046 136/249 |
| 4,633,030 A | 12/1986 | Cook | |
| 4,667,059 A | 5/1987 | Olson | |
| 4,775,639 A | 10/1988 | Yoshida | |
| 4,889,656 A | 12/1989 | Flynn et al. | |
| 4,916,503 A | 4/1990 | Uematsu et al. | |
| 4,989,059 A | 1/1991 | Micheels et al. | |
| 4,997,491 A | 3/1991 | Hokuyo et al. | |
| 5,101,260 A | 3/1992 | Nath et al. | |
| 5,103,268 A | 4/1992 | Yin et al. | |
| 5,116,427 A | 5/1992 | Fan et al. | |
| 5,136,351 A | 8/1992 | Inoue et al. | |
| 5,217,539 A | 6/1993 | Fraas et al. | |
| 5,223,043 A | 6/1993 | Olson et al. | |
| 5,316,593 A | 5/1994 | Olson et al. | |
| 5,330,585 A | 7/1994 | Chang et al. | |
| 5,342,453 A | 8/1994 | Olson | |
| 5,356,488 A | 10/1994 | Hezel | |
| 5,376,185 A | 12/1994 | Wanlass | |
| 5,385,960 A | 1/1995 | Emmons et al. | |
| 5,465,009 A | 11/1995 | Drabik et al. | |
| 5,468,652 A * | 11/1995 | Gee | 438/98 |
| 6,107,563 A | 8/2000 | Nakanishi et al. | |
| 6,166,218 A | 12/2000 | Ravichandran | |
| 6,166,318 A | 12/2000 | Freeouf | |
| 6,229,084 B1 | 5/2001 | Katsu | |
| 6,231,931 B1 | 5/2001 | Blazey et al. | |
| 6,255,580 B1 | 7/2001 | Karam et al. | |
| 6,372,981 B1 | 4/2002 | Ueda et al. | |
| 6,534,336 B1 | 3/2003 | Iwane et al. | |
| 6,617,508 B2 | 9/2003 | Kilmer et al. | |
| 7,038,250 B2 | 5/2006 | Sugiyama et al. | |
| 7,875,945 B2 | 1/2011 | Krasnov et al. | |
| 8,183,081 B2 | 5/2012 | Weidman et al. | |
| 8,258,596 B2 | 9/2012 | Nasuno et al. | |
| 8,664,515 B2 | 3/2014 | Hong et al. | |
| 8,697,553 B2 | 4/2014 | Adibi et al. | |
| 9,099,595 B2 | 8/2015 | King et al. | |
| 2001/0027805 A1 | 10/2001 | Ho et al. | |
| 2002/0000244 A1 | 1/2002 | Zaidi | |
| 2002/0053683 A1 | 5/2002 | Hill et al. | |
| 2002/0144724 A1 | 10/2002 | Kilmer et al. | |
| 2002/0179141 A1 | 12/2002 | Ho et al. | |
| 2003/0070707 A1 * | 4/2003 | King et al. | 136/255 |
| 2003/0140962 A1 | 7/2003 | Sharps et al. | |
| 2003/0222278 A1 | 12/2003 | Liu et al. | |
| 2004/0112426 A1 | 6/2004 | Hagino | |
| 2004/0166681 A1 | 8/2004 | Iles et al. | |
| 2004/0200523 A1 | 10/2004 | King et al. | |
| 2005/0022863 A1 | 2/2005 | Agostinelli et al. | |
| 2006/0081963 A1 | 4/2006 | Rehder et al. | |
| 2006/0090790 A1 * | 5/2006 | Kobayashi et al. | 136/256 |
| 2006/0144435 A1 | 7/2006 | Wanlass | |
| 2006/0162767 A1 | 7/2006 | Mascarenhas et al. | |
| 2006/0207651 A1 | 9/2006 | Posthuma et al. | |
| 2006/0255340 A1 | 11/2006 | Manivannan et al. | |
| 2007/0131275 A1 | 6/2007 | Kinsey et al. | |
| 2007/0137695 A1 | 6/2007 | Fetzer et al. | |
| 2007/0137698 A1 | 6/2007 | Wanlass et al. | |
| 2007/0151596 A1 | 7/2007 | Nasuno et al. | |
| 2007/0166862 A1 | 7/2007 | Kim et al. | |
| 2007/0199591 A1 | 8/2007 | Harder et al. | |
| 2007/0235074 A1 | 10/2007 | Henley et al. | |
| 2007/0277874 A1 | 12/2007 | Dawson-Elli et al. | |
| 2008/0128020 A1 | 6/2008 | Zafar et al. | |
| 2008/0245409 A1 | 10/2008 | Varghese et al. | |
| 2009/0151784 A1 | 6/2009 | Luan et al. | |
| 2009/0283802 A1 | 11/2009 | Henderson et al. | |
| 2010/0006143 A1 | 1/2010 | Weiser | |
| 2010/0015751 A1 | 1/2010 | Weidman et al. | |
| 2010/0055397 A1 | 3/2010 | Kurihara et al. | |
| 2010/0065117 A1 | 3/2010 | Kim et al. | |
| 2010/0089443 A1 | 4/2010 | Bloomstein et al. | |
| 2010/0096010 A1 | 4/2010 | Welser | |
| 2010/0126552 A1 | 5/2010 | Kizilyalli et al. | |
| 2010/0126570 A1 | 5/2010 | Kizilyalli et al. | |
| 2010/0126571 A1 | 5/2010 | Kizilyalli et al. | |
| 2010/0126572 A1 | 5/2010 | Kizilyalli et al. | |
| 2010/0132774 A1 | 6/2010 | Borden | |
| 2010/0132780 A1 | 6/2010 | Kizilyalli et al. | |
| 2010/0193002 A1 | 8/2010 | Dimroth et al. | |
| 2010/0294356 A1 | 11/2010 | Parikh et al. | |
| 2011/0088771 A1 | 4/2011 | Lin et al. | |
| 2011/0108098 A1 | 5/2011 | Kapur | |
| 2011/0156000 A1 | 6/2011 | Cheng | |
| 2011/0214728 A1 | 9/2011 | Veerasamy | |
| 2011/0244692 A1 | 10/2011 | Jeong et al. | |
| 2011/0290322 A1 | 12/2011 | Meguro et al. | |
| 2012/0024336 A1 | 2/2012 | Hwang | |
| 2012/0031478 A1 | 2/2012 | Boisvert et al. | |
| 2012/0055541 A1 | 3/2012 | Granek et al. | |
| 2012/0067423 A1 | 3/2012 | Lochtefeld et al. | |
| 2012/0104411 A1 | 5/2012 | Iza et al. | |
| 2012/0125256 A1 | 5/2012 | Kramer et al. | |
| 2012/0132930 A1 | 5/2012 | Young et al. | |
| 2012/0160296 A1 | 6/2012 | Laparra et al. | |
| 2012/0164796 A1 | 6/2012 | Lowenthal et al. | |
| 2012/0227805 A1 | 9/2012 | Hermle et al. | |
| 2013/0026481 A1 | 1/2013 | Xu et al. | |
| 2013/0112258 A1 | 5/2013 | Park et al. | |
| 2013/0220396 A1 | 8/2013 | Janssen et al. | |
| 2013/0288418 A1 | 10/2013 | Wang et al. | |
| 2014/0076386 A1 | 3/2014 | King et al. | |

(56) References Cited

U.S. PATENT DOCUMENTS

| | | | |
|---|---|---|---|
| 2014/0261611 A1 | 9/2014 | King et al. | |
| 2014/0312373 A1 | 10/2014 | Donofrio | |
| 2015/0171261 A1 | 6/2015 | Domine | |

FOREIGN PATENT DOCUMENTS

| | | |
|---|---|---|
| JP | 3-285368 | 12/1991 |
| JP | 06-244443 | 9/1994 |
| JP | 07-007148 | 1/1995 |
| JP | 8-130321 | 5/1996 |
| KR | 10-0762772 | 10/2007 |
| WO | WO 02065553 A1 | 8/2002 |
| WO | 2008100603 | 8/2008 |

OTHER PUBLICATIONS

Q. M. Zhang et al., "Effects of Displaced p-n Junction of Heterojunction Bipolar Transistors", IEEE Transactions on Electron Devices, vol. 39, No. 11, Nov. 1992, pp. 2430-2437.

Peter A. Lewis, "Pigment Handbook vol. I: Properties and Economics, 2nd Edition", John Wiley & Sons, New York, pp. 790-791 (1988).

B. H. Floyd, et al., "An N—AlGaAs P—GaAs Graded Heterojunction for High Concentration Ratios," pp. 81-86, IEEE, 1987.

Hiroshi Yamaguchi, et al., "Development Status of "Space Solar Sheet"", IEEE PVSC Proceedings, 2008.

Tatsuya Takamoto, et al., "Paper-Thin InGaP/GaAs Solar Cells", IEEE PVSC Proceedings, pp. 1769-1772, 2006.

Nielson et al. "Microfabrication of microsystem-enabled photovoltaic (MEPV) cells." Proceedings of the International Society of Optics and Photonics (SPIE) [online], (Jan. 25, 2011) Retreived from the internet: <URL: http://photovoltaics.sandia.gov/Pubs_2010/2011/Microfab_of_MEPV_Cells_SPIE_2011.pdf> See entire document especially Figure 5, p. 5.

Van Wijngaarden et al. "Direct Imaging of Propagation and Damping of Near-Resonance Surface Plasmon Polaritons using Cathodoluminescence Spectroscopy" (Jun. 1, 2006) Appl. Phys. Left. 88, 221111, pp. 1-3.

Pacifici et al. "Quantitative Determination of Optical Transmission through Subwavelength Slit Arrays in Ag films: The Essential role of Surface Wave Interference and Local Coupling between Adjacent Slits" (Oct. 22, 2007) Thomas J. Watson Lab. of Appl. Phys., pp. 1-4.

Park et al. "Surface Plasmon Enhanced Photoluminescence of Conjugated Polymers" (Apr. 17, 2007) Appl. Phys. Letters 90, 161107, pp. 1-3.

Tanabe et al. "Direct-bonded GaAs/InGaAs Tandem Solar Cell" (Sep. 6, 2006) Appl. Phys. Left. 89, 102106, pp. 1-3.

Dionne et al. "Highly Confined Photon Transport in Subwavelength Metallic Slot Waveguides" (Jun. 20, 2006) Nano Lett., vol. 6, No. 9, pp. 1928-1932.

Biteen et al. "Spectral Tuning of Plasmon-enhanced Silicon Quantum Dot Luminescence" (Mar. 31, 2006) Applied Physics Letters 88, 131109, pp. 1-3.

Aisaka et al. "Enhancement of upconversion Luminescence of Er Doped Al2O3 Films by Ag Islands Films" (Apr. 1, 2008) Applied Physics Letters 92, 132105, pp. 1-3.

Lezec et al. "Negative Refraction at Visible Frequencies" (Apr. 20, 2007) Science, vol. 316, pp. 430-432.

Pillai et al. "Enhanced emission from Si-based Light-emitting Diodes using Surface Plasmons" (Apr. 17, 2006) Applied Physics Letters, 88, 161102, pp. 1-3.

"Volmer-Weber and Stranski-Krastanov InAs..As quantum dots emitting at 1.3um" by Tsatsul'nikov et al., Journal of Applied Physics, vol. 88, No. 11, Dec. 1, 2000.

"The Stranski—Krastanov Three Dimensional Island Growth Prediction on Finite Size Model" to Othaman et al., 2008.

\* cited by examiner

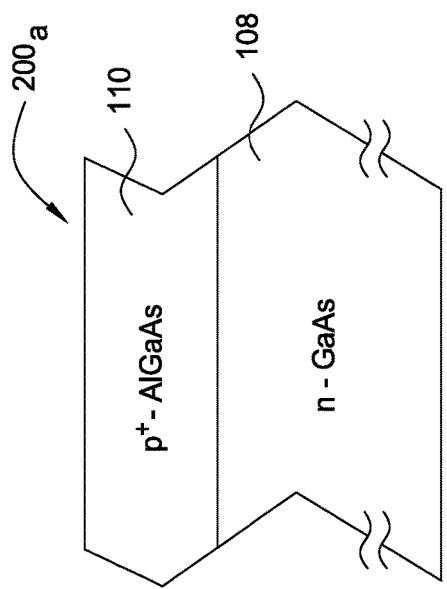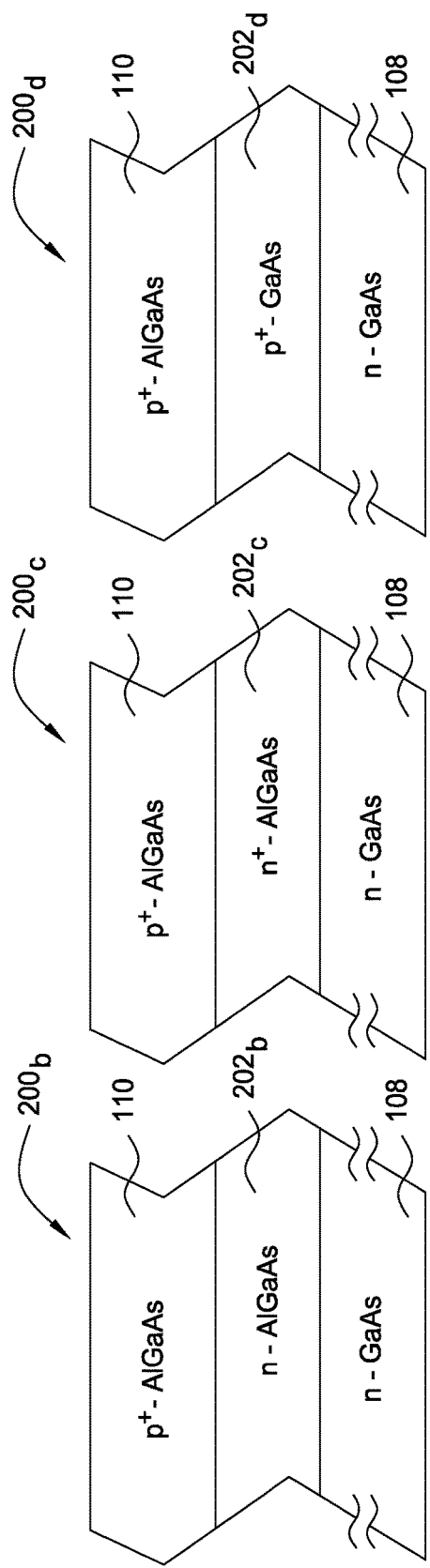

PHOTOVOLTAIC DEVICE

CROSS-REFERENCE TO RELATED APPLICATIONS

Under 35 U.S.C. § 120, this application is a Continuation application and claims the benefit of priority to U.S. patent application Ser. No. 12/605,108, filed Oct. 23, 2009 and U.S. Provisional Patent Application Ser. No. 61/107,954, filed Oct. 23, 2008, all of which is incorporated herein by reference.

BACKGROUND

Technical Field

Embodiments of the present invention generally relate to photovoltaic (PV) devices, such as solar cells, with increased efficiency and greater flexibility and methods for fabricating the same.

Description of the Related Art

As fossil fuels are being depleted at ever-increasing rates, the need for alternative energy sources is becoming more and more apparent. Energy derived from wind, from the sun, and from flowing water offer renewable, environment-friendly alternatives to fossil fuels, such as coal, oil, and natural gas. Being readily available almost anywhere on Earth, solar energy may someday be a viable alternative.

To harness energy from the sun, the junction of a solar cell absorbs photons to produce electron-hole pairs, which are separated by the internal electric field of the junction to generate a voltage, thereby converting light energy to electric energy. The generated voltage can be increased by connecting solar cells in series, and the current may be increased by connecting solar cells in parallel. Solar cells may be grouped together on solar panels. An inverter may be coupled to several solar panels to convert DC power to AC power.

Nevertheless, the currently high cost of producing solar cells relative to the low efficiency levels of contemporary devices is preventing solar cells from becoming a mainstream energy source and limiting the applications to which solar cells may be suited. Accordingly, there is a need for more efficient photovoltaic devices suitable for a myriad of applications.

SUMMARY OF THE INVENTION

Embodiments of the present invention generally relate to methods and apparatus for converting electromagnetic radiation, such as solar energy, into electric energy with increased efficiency when compared to conventional solar cells.

One embodiment of the present invention provides a photovoltaic (PV) device. The PV device comprises an absorber layer made of a compound semiconductor; and an emitter layer located closer than the absorber layer to a first side of the device. The PV device includes a p-n junction formed between the emitter layer and the absorber layer, the p-n junction causing a voltage to be generated in the device in response to the device being exposed to light at a second side of the device.

BRIEF DESCRIPTION OF THE DRAWINGS

So that the manner in which the above-recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-D illustrate various layer stack profiles for the base and emitter layers of the PV unit, in accordance with embodiments of the present invention.

DETAILED DESCRIPTION

Embodiments of the present invention provide techniques and apparatus for converting electromagnetic radiation, such as solar energy, into electric energy with increased efficiency when compared to conventional solar cells.

AN EXEMPLARY THIN ABSORBER LAYER

Figure 1:
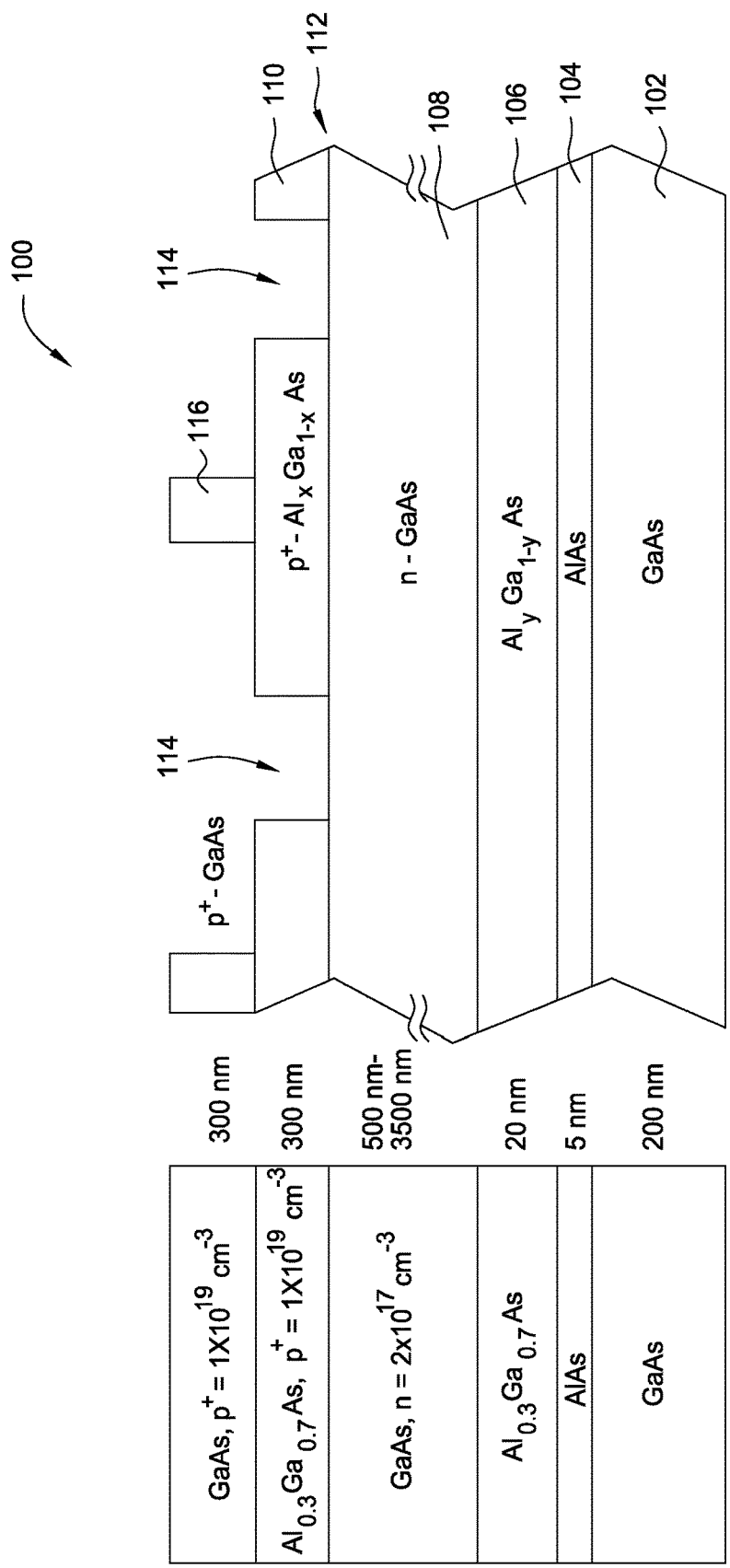
FIG. 1 illustrates multiple epitaxial layers for a photovoltaic (PV) unit in cross-section with example thickness, composition, and doping of the semiconductor layers, in accordance with an embodiment of the present invention.

FIG. 1 illustrates various epitaxial layers of a photovoltaic (PV) unit 100 in cross-section during fabrication. The various layers may be formed using any suitable method for semiconductor growth, such as molecular beam epitaxy (MBE) or metalorganic chemical vapor deposition (MOCVD), on a substrate (not shown).

To form the PV unit 100, one or more buffer layers may be formed on the substrate. The purpose of the buffer layer(s) is to provide an intermediary between the substrate and the semiconductor layers of the final PV unit that can accommodate their different crystallographic structures as the various epitaxial layers are formed. Having a thickness of about 200 nm, for example, a buffer layer 102 may comprise a group III-V compound semiconductor, such as gallium arsenide (GaAs), depending on the desired composition of the final PV unit. For some embodiments, for example, the substrate may comprise GaAs when creating a GaAs buffer layer.

For some embodiments, a release layer 104 may be formed above the buffer layer 102. The release layer 104 may comprise aluminum arsenide (AlAs), for example, and have a thickness in a range from about 5 to 10 nm. The purpose of the thin release layer 104 is described in greater detail below.

Above the release layer 104, a window layer 106 may be formed. The window layer 106 may comprise aluminum gallium arsenide (AlGaAs), such as $Al_{0.3}Ga_{0.7}As$. The window layer 106 may have a thickness in a range of about 5 to 30 nm (e.g., 20 nm as shown) and may be undoped. The window layer 106 may be transparent to allow photons to pass through the window layer on the front side of the PV unit to other underlying layers.

A base layer 108 may be formed above the window layer 106. The base layer 108 may comprise any suitable group III-V compound semiconductor, such as GaAs. The base layer 108 may be monocrystalline. The base layer 108 may be n-doped, and for some embodiments, the doping concentration of the n-doped base layer 108 may be in a range from about $1\times10^{16}$ to $1\times10^{19}$ $cm^{-3}$ (e.g., $2\times10^{17}$ $cm^{-3}$ as shown). The thickness of the base layer 108 may be in a range from about 300 to 3500 nm.

As illustrated in FIG. 1, an emitter layer 110 may be formed above the base layer 108. The emitter layer 110 may comprise any suitable group III-V compound semiconductor for forming a heterojunction with the base layer 108. For example, if the base layer 108 comprises GaAs, the emitter layer 110 may comprise a different semiconductor material, such as AlGaAs. If the emitter layer 110 and the window layer 106 both comprise AlGaAs, the $Al_xGa_{1-x}As$ composition of the emitter layer 110 may be the same as or different than the $Al_yGa_{1-y}As$ composition of the window layer 106. The emitter layer 110 may be monocrystalline. The emitter layer 110 may be heavily p-doped (i.e., $p^+$-doped), and for some embodiments, the doping concentration of the $p^+$-doped emitter layer may be in a range from about $1\times10^{17}$ to $1\times10^{20}$ $cm^{-3}$ (e.g., $1\times10^{19}$ $cm^{-3}$ as shown). The thickness of the emitter layer 110 may be about 300 nm, for example. The combination of the base layer 108 and the emitter layer 110 may form an absorber layer for absorbing photons. For some embodiments, the absorber layer may have a thickness less than 800 nm, or even less than 500 nm.

The contact of an n-doped base layer to a $p^+$-doped emitter layer creates a p-n layer 112. When light is absorbed near the p-n layer 112 to produce electron-hole pairs, the built-in electric field may force the holes to the $p^+$-doped side and the electrons to the n-doped side. This displacement of free charges results in a voltage difference between the two layers 108, 110 such that electron current may flow when a load is connected across terminals coupled to these layers.

Rather than an n-doped base layer 108 and a $p^+$-doped emitter layer 110 as described above, conventional photovoltaic semiconductor devices typically have a p-doped base layer and an $n^+$-doped emitter layer. The base layer is typically p-doped in conventional devices due to the diffusion length of the carriers. Fabricating a thinner base layer according to embodiments of the invention allows for the change to an n-doped doped base layer. The higher mobility of electrons in an n-doped layer compared to the mobility of holes in a p-doped layer leads to the lower doping density in the n-doped base layer 108 of embodiments of the invention.

Once the emitter layer 110 has been formed, cavities or recesses 114 may be formed in the emitter layer deep enough to reach the underlying base layer 108. Such recesses 114 may be formed by applying a mask to the emitter layer 110 using photolithography, for example, and removing the semiconductor material in the emitter layer 110 not covered by the mask using any suitable technique, such as wet or dry etching. In this manner, the base layer 108 may be accessed via the back side of the PV unit 100.

For some embodiments, an interface layer 116 may be formed above the emitter layer 110. The interface layer 116 may comprise any suitable group III-V compound semiconductor, such as GaAs. The interface layer 116 may be $p^+$-doped, and for some embodiments, the doping concentration of the $p^+$-doped interface layer 116 may be $1\times10^{19}$ $cm^{-3}$. The thickness of the interface layer 116 may be about 300 nm, for example.

Once the remaining epitaxial layers have been formed above the release layer 104, the thin release layer 104 may be sacrificed via etching with aqueous HF, for example. In this manner, the functional layers of the PV unit 100 (e.g., the window layer 106, the base layer 108, and the emitter layer 110) may be separated from the buffer layer(s) 102 and substrate during the epitaxial lift-off (ELO) process.

A PV unit created in this manner has a significantly thin absorber layer (e.g., <500 nm) compared to conventional solar units, which may be several micrometers thick. The thickness of the absorber layer is proportional to dark current levels in the PV unit (i.e., the thinner the absorber layer, the lower the dark current). Dark current is the small electric current that flows through the PV unit or other similar photosensitive device (e.g., a photodiode) even when no photons are entering the device. This background current may be present as the result of thermionic emission or other effects. Because the open circuit voltage ($V_{oc}$) increases as the dark current is decreased in a photosensitive semiconductor device, a thinner absorber layer may most likely lead to a greater $V_{oc}$ for a given light intensity and, thus, increased efficiency. As long as the absorber layer is able to trap light, the efficiency increases as the thickness of the absorber layer is decreased.

The thinness of the absorber layer may not only be limited by the capabilities of thin film technology and ELO. For example, efficiency increases with the thinness of the absorber layer, but the absorber layer should be thick enough to carry current. However, higher doping levels may allow current to flow, even in very thin absorber layers. Therefore, increased doping may be utilized to fabricate very thin absorber layers with even greater efficiency. Conventional PV devices may suffer from volume recombination effects, and therefore, such conventional devices do not employ high doping in the absorber layer. The sheet resistance of the absorber layer may also be taken into consideration when determining the appropriate thickness.

Not only does a thin absorber layer lead to increased efficiency, but PV units with such a thin absorber layer may be more flexible than conventional solar cells having a thickness of several micrometers. Therefore, PV units according to embodiments of the invention may be appropriate for a greater number of applications than conventional solar cells.

FIGS. 2A-D illustrate various layer stack profiles $200_{a-d}$ for the base and emitter layers 108, 110 of the PV unit, in accordance with embodiments of the present invention. The layer stack profile $200_a$ in FIG. 2A illustrates the base and emitter layers 108, 110 as illustrated in FIG. 1. For some embodiments, an intermediate layer 202 may be formed above the base layer 108, and the emitter layer 110 may be formed above the intermediate layer. The intermediate layer 202 may provide a more gradual transition between the base and emitter layers 108, 110.

The intermediate layer 202 may be n-doped, heavily n-doped (i.e., $n^+$-doped), or $p^+$-doped. For example, FIG. 2B illustrates an intermediate layer $202_b$ comprising n-AlGaAs. As another example, FIG. 2C depicts an intermediate layer $202_c$ comprising $n^+$-AlGaAs. As yet another example, FIG. 2D portrays an intermediate layer $202_d$ comprising $p^+$-GaAs.

Figure 3A:
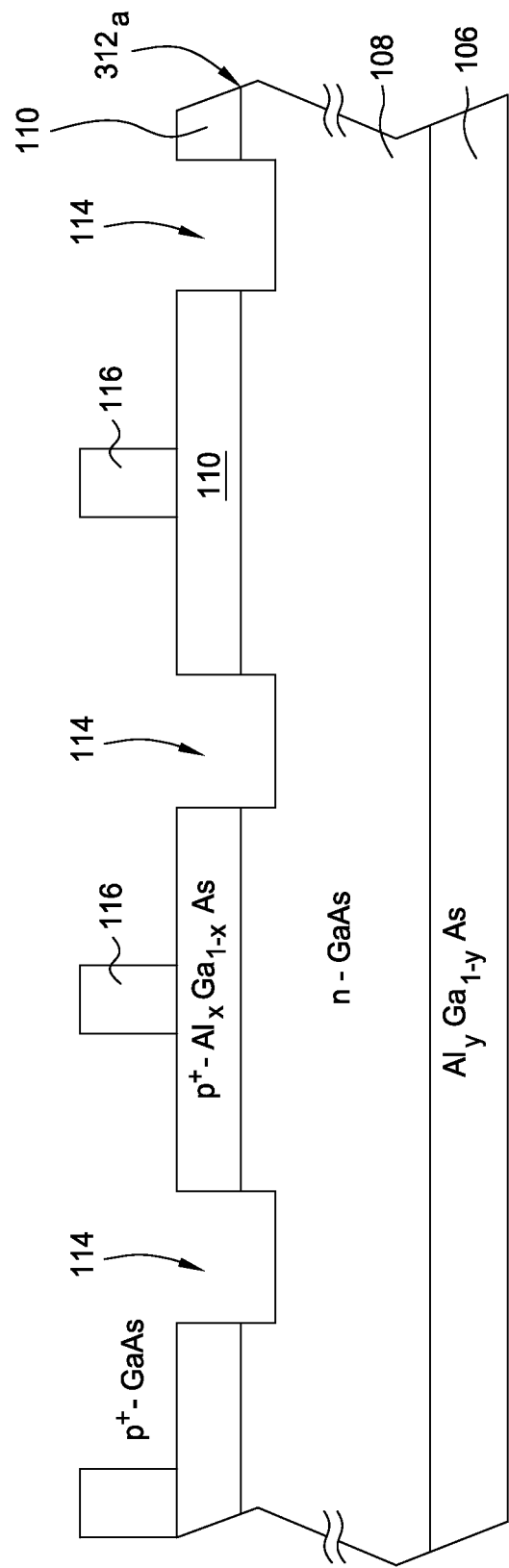
FIGS. 3A and 3B illustrate semiconductor layers for a PV unit with offset p-n layers between the base and emitter layers, in accordance with embodiments of the present invention.
Figure 3B:
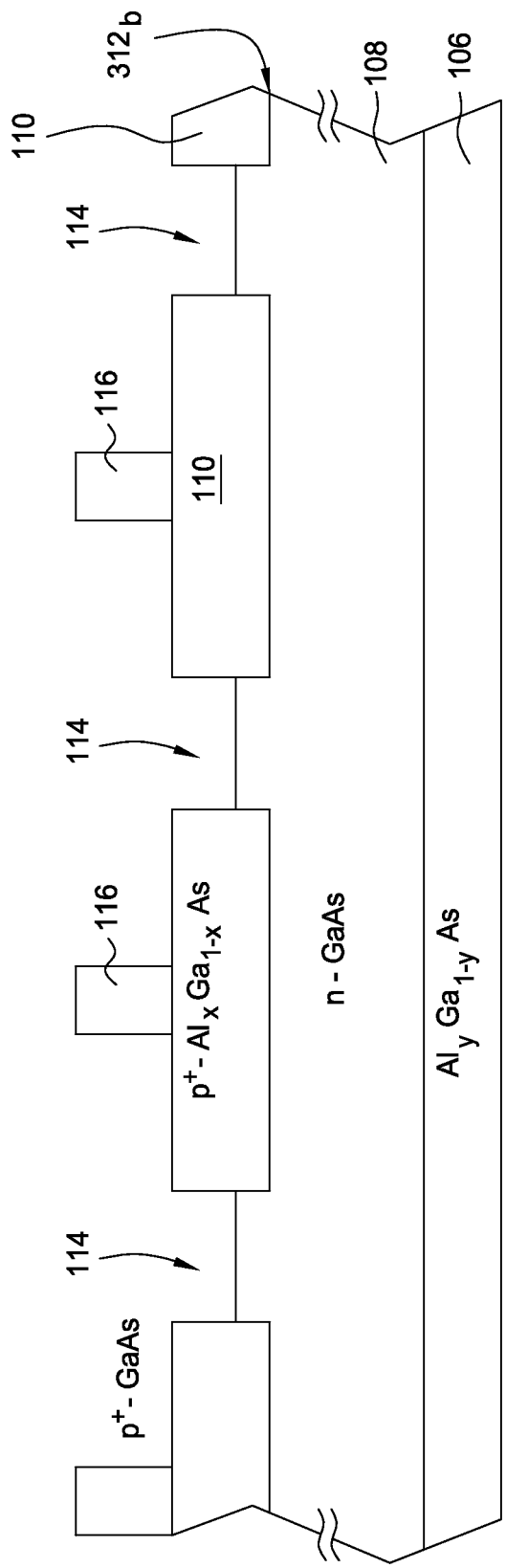

In FIG. 1, the p-n layer 112 between the base layer 108 and the emitter layer 110 is flat and is not exposed in the recesses 114. In other words, the p-n layer 112 of FIG. 1 may be considered as a plane having only two-dimensional geometry. For some embodiments, as shown in FIGS. 3A and 3B, the semiconductor layers for a PV unit may be formed to create an offset p-n layer 312 between the base and emitter layers 108, 110. In other words, an offset p-n layer 312 may be considered to have three-dimensional geometry. An offset p-n layer 312 may be exposed in the recesses 114.

As illustrated in FIG. 3A, an offset p-n layer $312_a$ may be produced by removing semiconductor material all the way through the emitter layer 110 and partially into the base layer 108 when forming the recesses 114 as described above. Another method of forming an offset p-n layer $312_b$, as illustrated in FIG. 3B, may comprise applying a mask to the base layer 108 before forming the emitter layer 110. Semiconductor material may be removed via any suitable technique, such as etching, from a portion of the base layer 108 where the emitter layer is intended to remain (i.e., everywhere except the desired locations of the recesses 114). Once the emitter layer 110 and the recesses 114 are formed in the emitter layer, the resulting offset p-n layer $312_b$ has a greater surface area than a flat p-n layer 112.

Figure 4:
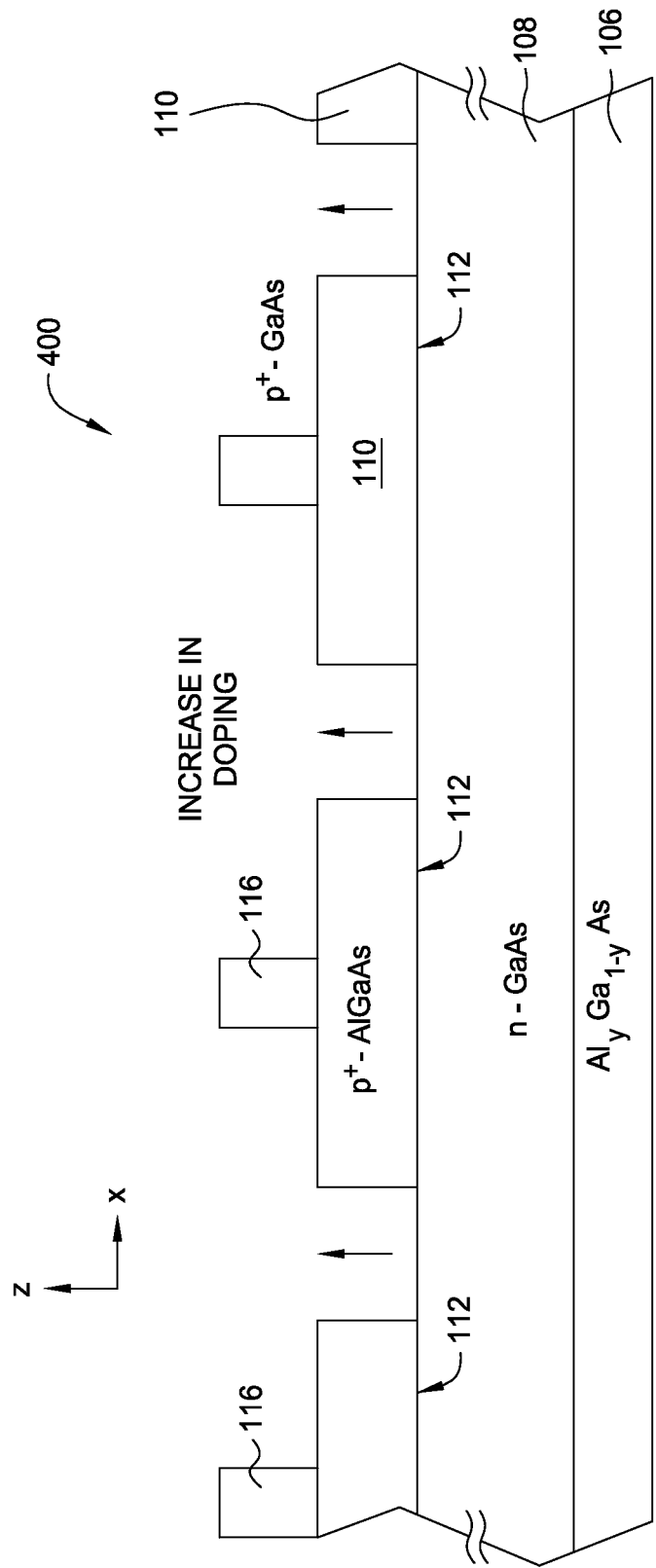
FIG. 4 illustrates semiconductor layers for a PV unit with an emitter layer having a doping profile fine-tuned such that the doping levels increase from the p-n layer to the top of the emitter layer, in accordance with an embodiment of the present invention.

For some embodiments, doping levels may be fine-tuned within a layer of the PV unit during fabrication. For example, FIG. 4 illustrates a PV unit 400 with an emitter layer 110 having a doping profile fine-tuned such that the doping concentration increases from the p-n layer 112 to the top of the emitter layer 110 in the z-direction.

Figure 5:
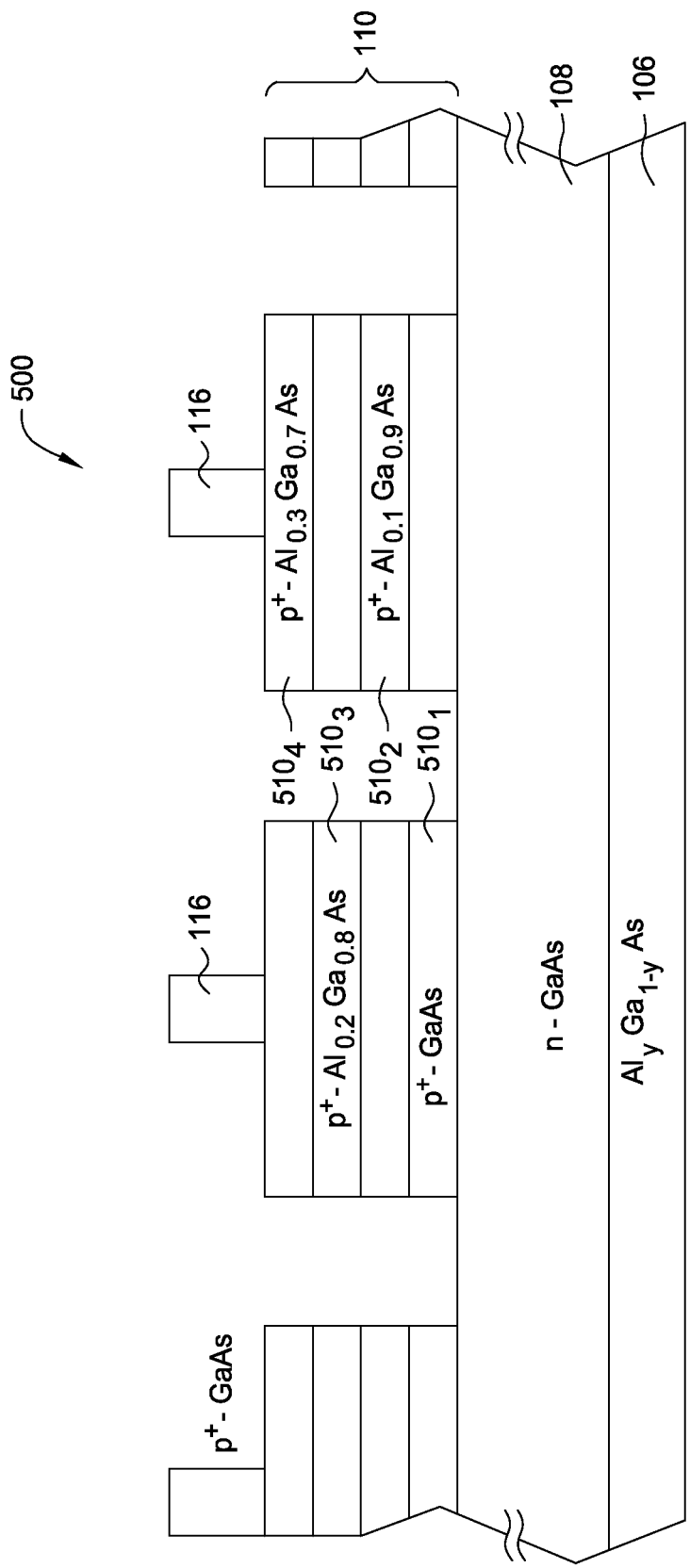
FIG. 5 illustrates semiconductor layers for a PV unit with multiple AlGaAs emitter layers having graded aluminum (Al) levels, in accordance with an embodiment of the present invention.

For some embodiments, the emitter layer 110 may comprise multiple layers, and the multiple layers may comprise different compositions. For example, FIG. 5 illustrates semiconductor layers for a PV unit 500 with multiple $p^+$-AlGaAs emitter layers having graded aluminum (Al) levels (i.e., percentages), in accordance with an embodiment of the present invention. In this example embodiment, a first emitter layer $510_1$ comprising $p^+$-GaAs without any aluminum may be formed above the base layer 108. A second emitter layer $510_2$ comprising $p^+$-$Al_{0.1}Ga_{0.3}As$ may be formed above the first emitter layer $510_1$. Then, a third emitter layer $510_3$ comprising $p^+$-$Al_{0.2}Ga_{0.8}As$ and a fourth emitter layer $510_4$ comprising $p^+$-$Al_{0.3}Ga_{0.7}As$ may be formed above the second emitter layer $510_2$, in turn. Having such graded Al levels may avoid junction barriers.

Exemplary Electrical Contacts

Electrical contacts may be used to couple the semiconductor layers of the PV unit 100 to wires for connection to other PV units and for external connection to a load. A conventional solar cell typically has contacts on both the front and back sides of the cell. Front side contacts, especially thicker ones, create shadows where light cannot reach the underlying absorber layer to be converted into electric energy. Therefore, the efficiency potential of the solar cell cannot be obtained. Accordingly, techniques and apparatus for contacting the semiconductor layers of the PV unit without introducing shadows are needed.

Figure 6:
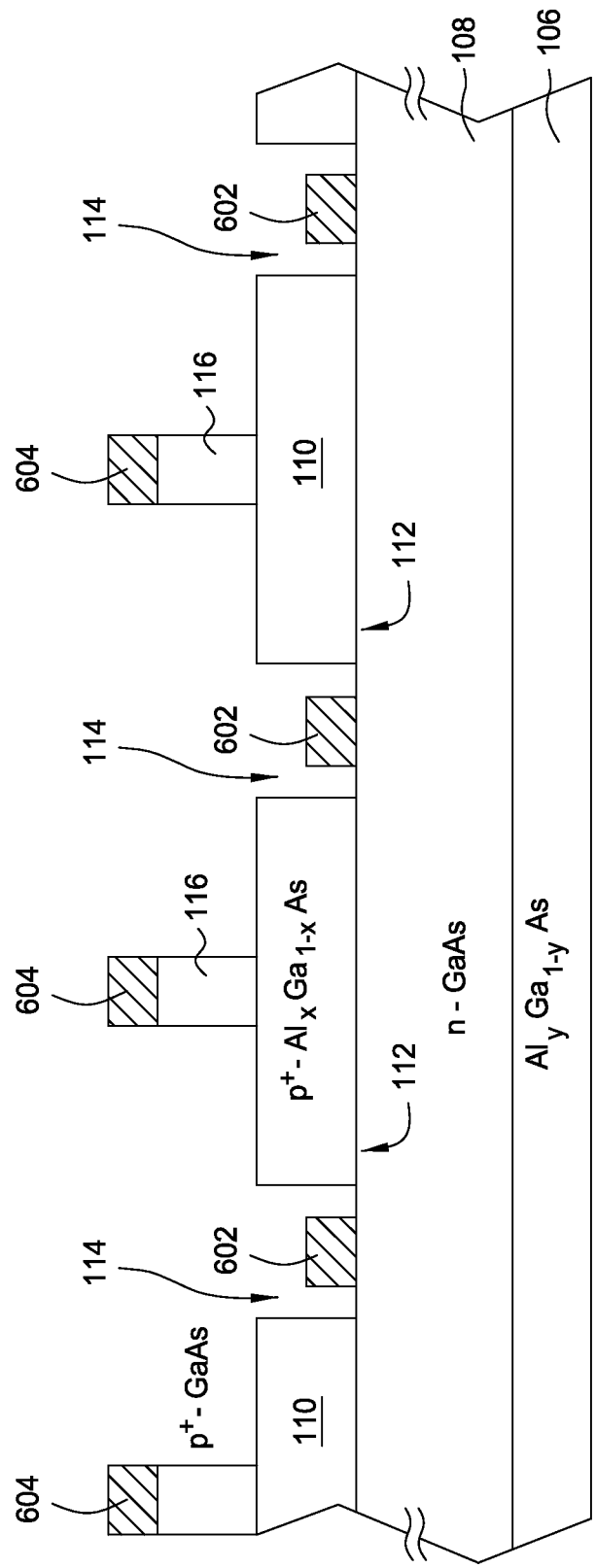
FIG. 6 illustrates contacts to the semiconductor layers being on the back side of the PV unit, in accordance with an embodiment of the present invention.

FIG. 6 illustrates all electrical contacts to the semiconductor layers being on the back side of the PV unit 100, according to an embodiment of the present invention. For example, n-contacts 602 may be formed in the recesses 114 to provide an interface to the n-doped base layer 108, and p-contacts 604 may be formed above the interface layer 116 to couple to the $p^+$-doped emitter layer 110. The heavy doping in the $p^+$-doped interface layer 116 may facilitate making an ohmic contact. In this manner, efficiency need not be sacrificed by having electrical contacts on the front side of the PV unit to block light and create solar shadows.

The pattern of the recesses 114 in the emitter layer 110 and the remaining portion of the interface layer 116 for the contacts 602, 604 may be based on the desired sheet resistance. The dimensions (e.g., area) of the contacts 602, 604 may be very small compared to the dimensions (e.g., area) of a single PV unit 100. What is more, the pattern of the contacts 602, 604 may provide a built-in tolerance against local defects and shadowing.

The contacts 602, 604 may comprise any suitable electrically conductive material, such as a metal or a metal alloy. Preferably, the material for the contacts should not punch through the semiconductor layers during fabrication. Traditional contacts comprising gold (Au) often had this spiking problem. Furthermore, the material for the back side contacts may preferably be capable of being applied at relatively low metallization process temperatures, such as between 150 and 200° C. For example, the contact 602, 604 may comprise palladium/germanium (Pd/Ge) to meet these design goals. Palladium does not react with GaAs.

Whatever material is selected, the contacts 602, 604 may be fabricated on the PV unit 100 by any suitable method, such as vacuum-evaporation through a photoresist, photolithography, screen printing, or merely depositing on the exposed portion of the PV units that have been partially covered with wax or another protective material. These methods all involve a system in which the part of the PV unit on which a contact is not desired is protected, while the rest of the PV unit is exposed to the metal. Of these, screen printing may be the most cost effective, helping to decrease the cost of the resulting PV devices.

Despite all the contacts 602, 604 being on the back side of the PV unit 100 to reduce solar shadows, dark current and its stability with time and temperature may still be concerns when designing an efficient PV unit. An exposed p-n layer 112 may be a source of dark current, and larger recesses 114 may be responsible for an increase in dark current. Thus, smaller recesses 114 may be desired. However, there is a tradeoff between reducing the size of the recesses 14 to reduce dark current and the probability of fabricating the n-contacts 602 in the recesses 114 without touching the sidewalls.

Figure 7:
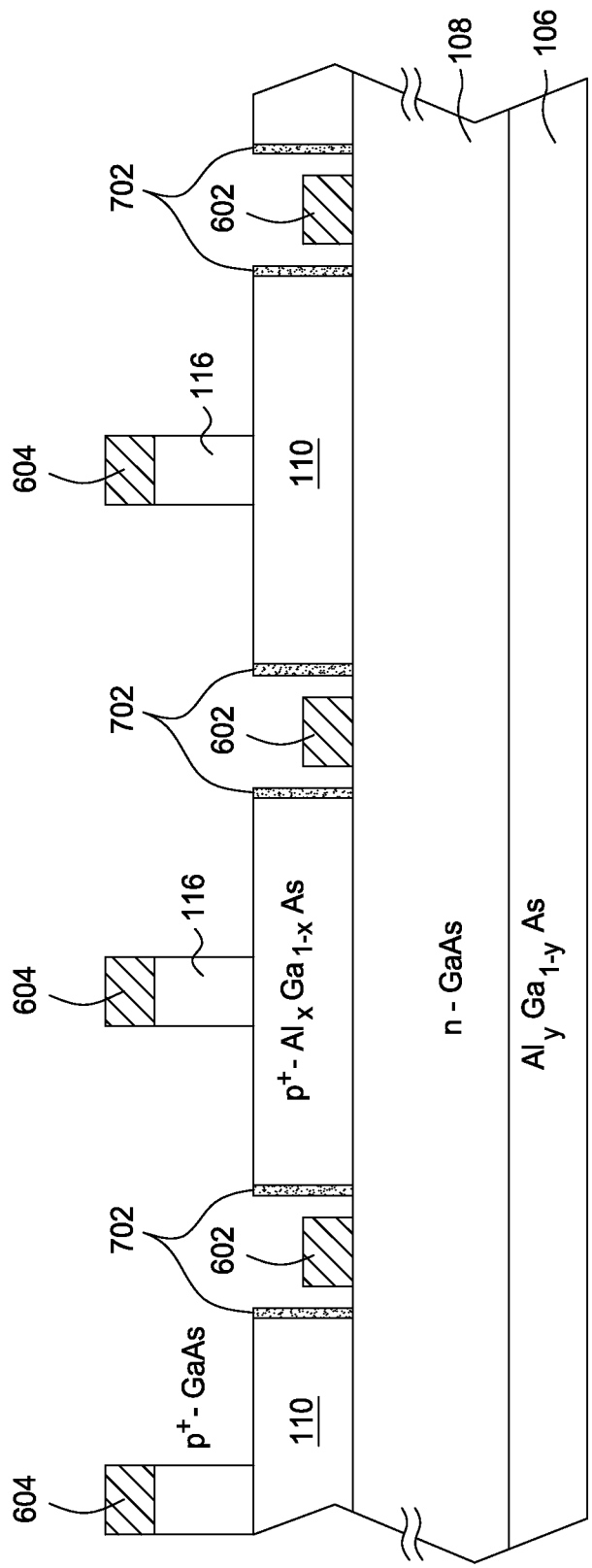
FIG. 7 illustrates passivation on the edges of the recesses in the emitter layer, in accordance with an embodiment of the present invention.

Therefore, for some embodiments, the sidewalls of the recesses 114 may be passivated as another way to reduce the dark current in the PV unit. FIG. 7 illustrates passivation 702 on the sidewalls (i.e., lateral surfaces) of the recesses 114 in the emitter layer 110, in accordance with an embodiment of the present invention. The sidewalls may be passivated most likely before—but possibly after—the n-contacts 602 are formed, using any suitable passivation method, such as chemical vapor deposition (CVD) or plasma-enhanced CVD (PECVD). The passivation 702 may comprise any suitable electrically non-conductive material, such as silicon nitride (SiN), $SiO_x$, $TiO_x$, $TaO_x$, zinc sulfide (ZnS), or any combination thereof.

Exemplary Light Trapping

To achieve efficiency, the absorber layer of an ideal photovoltaic (PV) device would absorb all of the photons impinging on the PV device's front side facing the light source since the open circuit voltage ($V_{oc}$) or short circuit current ($I_{sc}$) is proportional to the light intensity. However, several loss mechanisms typically interfere with the PV device's absorber layer seeing or absorbing all of the light reaching the front side of the device. For example, the semiconductor layers of the PV device may be shiny (especially when made of pure silicon) and, therefore, may reflect a substantial portion of the impinging photons, preventing these photons from ever reaching the absorber layer. If two semiconductor layers (e.g., the window layer and the base layer) have a different index of refraction, some of the photons reaching the interface between these two layers may be reflected according to Snell's Law if their angle of incidence is too high, again preventing these photons from reaching the absorber layer. Furthermore, the absorber layer may not absorb all of the impinging photons; some photons may pass through the absorber layer without affecting any electron-hole pairs.

Accordingly, there is a need for techniques and apparatus to capture the light impinging on the front side of the PV device such that as many photons as possible may be absorbed by the absorber layer and converted into electric energy. In this manner, the PV device's efficiency may be increased.

Apparatus for trapping the light within the semiconductor layers of a PV device may be divided into two categories: front side light trapping and back side light trapping. By employing both types of light trapping in a PV device, the idea is that nearly all photons impinging on the PV device's front side may be captured and "bounce around" within the semiconductor layers until the photons are absorbed by the absorber layer and converted to electric energy.

Exemplary Front Side Light Trapping

Figure 8:
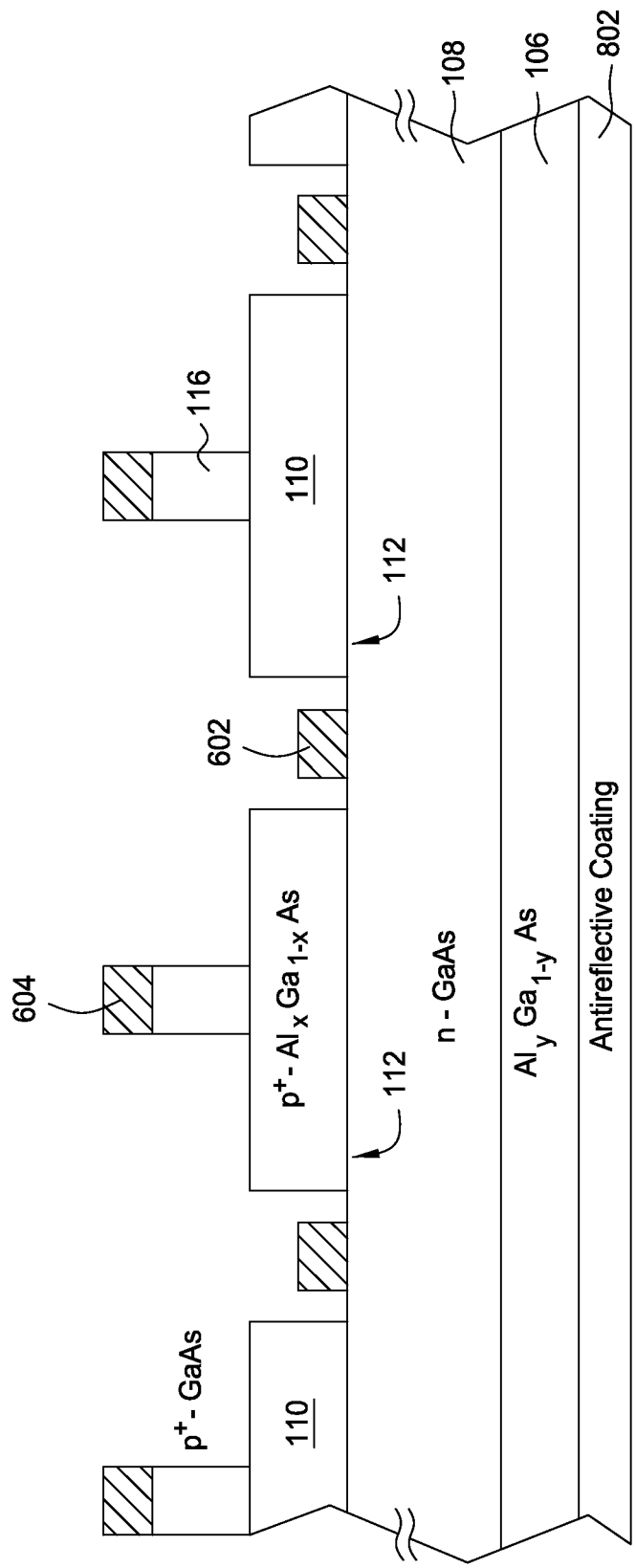
FIG. 8 illustrates an antireflective coating added to the semiconductor layers on the front side of the PV unit, in accordance with an embodiment of the present invention.

FIG. 8 illustrates an antireflective (AR) coating 802 disposed adjacent to the window layer 106 on the front side of the PV unit 100, in accordance with an embodiment of the present invention. According to its purpose, the AR coating 802 may comprise any suitable material that allows light to pass through while preventing light reflection from its surface. For example, the AR coating 802 may comprise magnesium fluoride ($MgF_2$), zinc sulfide (ZnS), silicon nitride (SiN), titanium dioxide ($TiO_2$), silicon dioxide ($SiO_2$), or any combination thereof. The AR coating 802 may be applied to the window layer 106 by any suitable technique, such as sputtering.

Figure 9:
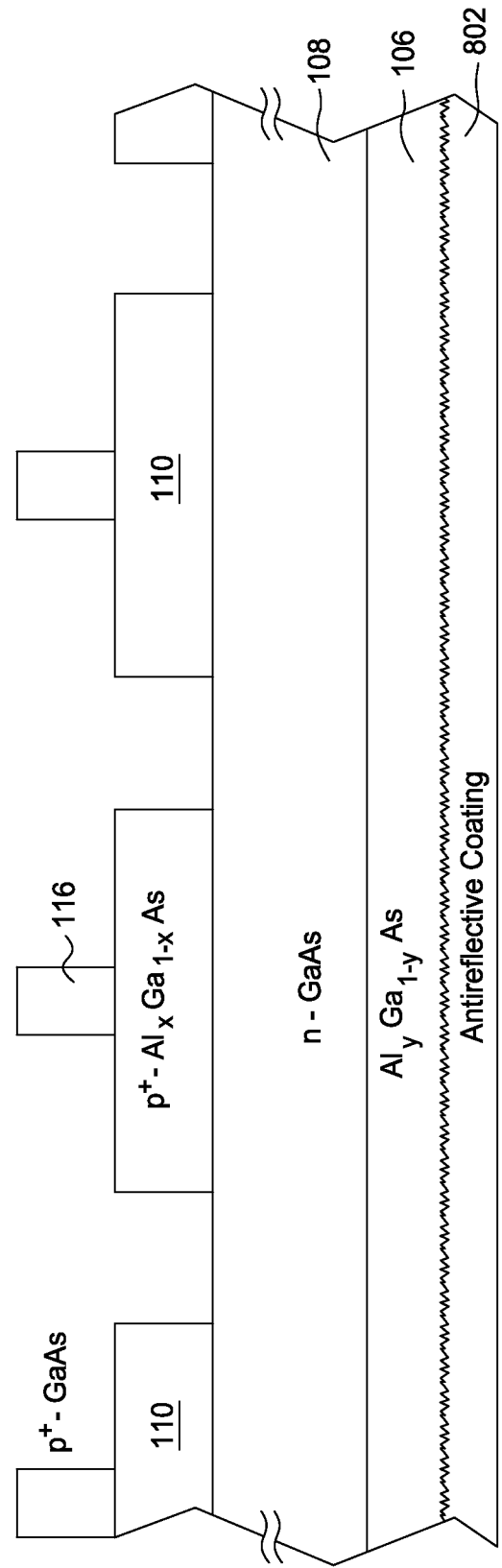
FIG. 9 illustrates roughening a window layer before applying the antireflective coating, in accordance with an embodiment of the present invention.

For some embodiments, the window layer 106 may be roughened or textured before applying the antireflective coating 802. FIG. 9 illustrates a roughened window layer 106. Roughening of the window layer 106 may be accomplished by wet etching or dry etching, for example. Texturing may be achieved by applying small particles, such as polystyrene spheres, to the surface of the window layer 106 before applying the AR coating 802. By roughening or texturing the window layer 106, different angles are provided at the interface between the AR coating 802 and the window layer, which may have different indices of refraction. In this manner, more of the incident photons may be transmitted into the window layer 106 rather than reflected from the interface between the AR coating 802 and the window layer because some photons' angles of incidence are too high according to Snell's Law. Thus, roughening or texturing the window layer 106 may provide increased light trapping.

Figure 10:
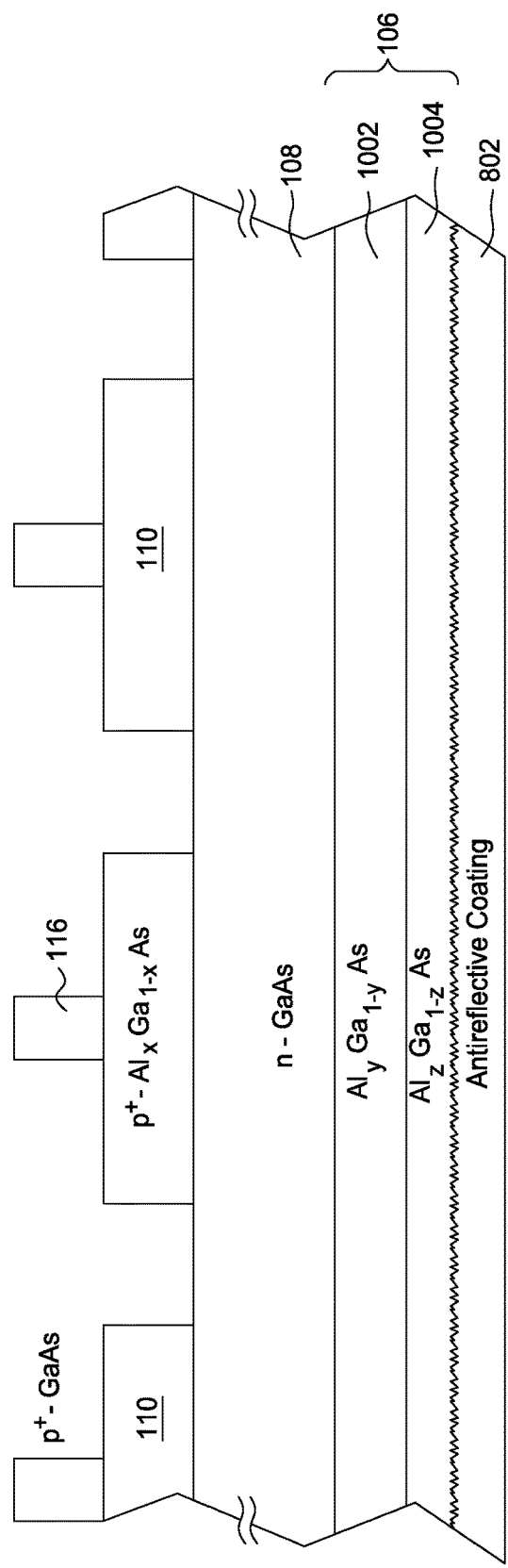
FIG. 10 illustrates multiple window layers, wherein the outermost window layer is roughened before the antireflective coating is applied, in accordance with an embodiment of the present invention.

Also for some embodiments, the window layer 106 may comprise multiple window layers. For these embodiments, the outermost window layer (i.e., the window layer closest to the front side of the PV unit 100) may be roughened or textured as described above before the antireflective coating 802 is applied, as illustrated in FIG. 10. In FIG. 10, the window layer 106 comprises a first window layer 1002 disposed adjacent to the base layer 108 and a second window layer 1004 interposed between the first window layer 1002 and the antireflective coating 802. The first and second window layers 1002, 1004 may comprise any material suitable for the window layer 106 as described above, such as AlGaAs, but typically with different compositions. For example, the first window layer 1002 may comprise $Al_{0.3}Ga_{0.7}As$, and the second window layer 1004 may comprise $Al_{0.1}Ga_{0.9}As$. Furthermore, some of the multiple window layers may be doped, while others are undoped for some embodiments. For example, the first window layer 1002 may be doped, and the second window layer 1004 may be undoped.

Exemplary Back Side Light Trapping

Figure 11:
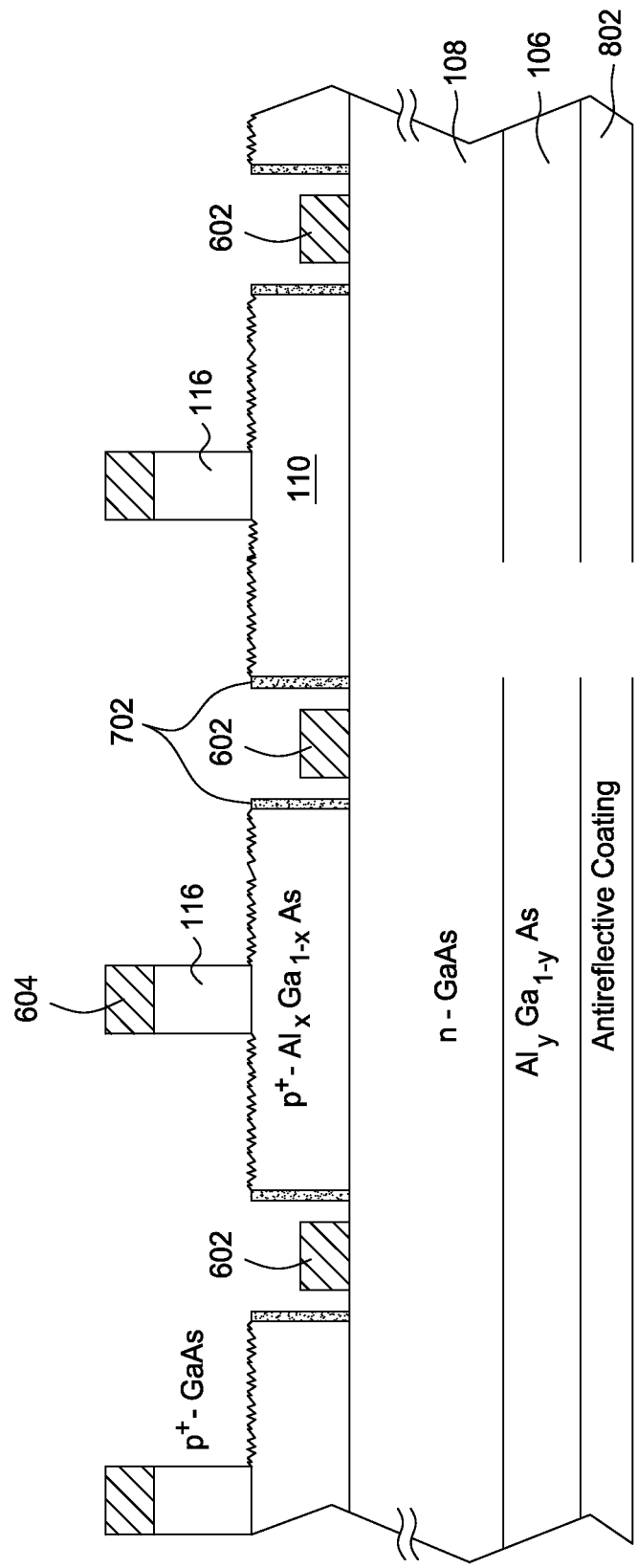
FIG. 11 illustrates a roughened emitter layer on the back side of the PV unit, in accordance with an embodiment of the present invention.

For some embodiments, the emitter layer 110 on the back side of the PV unit 100 may be roughened or textured, as described above with respect to the front side, in an effort to increase light trapping. FIG. 11 illustrates such a roughened emitter layer 110.

Figure 12:
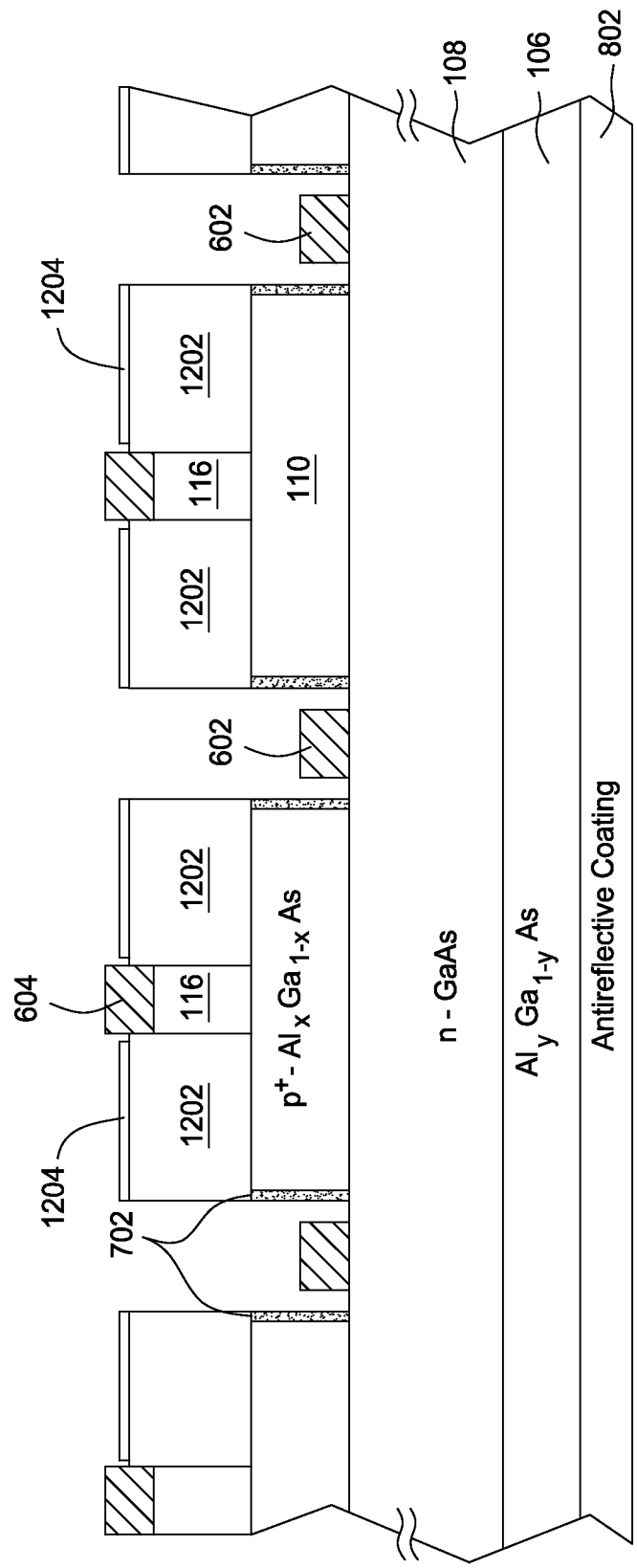
FIG. 12 illustrates a diffuser on the back side of the PV unit, in accordance with an embodiment of the present invention.

FIG. 12 illustrates a diffuser 1202 on the back side of the PV unit 100 in an effort to increase the amount of light captured by the absorber layer. Rather than reflecting photons similar to a mirror where the angle of reflectance equals the angle of incidence, the purpose of the diffuser 1202 is to diffuse or scatter photons that pass through the absorber layer without being absorbed. For some embodiments, the diffuser 1202 may be covered with a reflective layer 1204. In this manner, the diffuser 1202 may provide new angles to incident photons, some of which may be redirected back to the interior of the PV unit. For other photons that are directed to the back side of the PV unit, the reflective layer 1204 may redirect these photons back through the diffuser 1202 and towards the interior of the PV unit. Although some of the light may be absorbed by the diffuser 1202 as the photons are scattered and redirected inside, much of the light is redirected to the absorber layer to be absorbed and converted into electric energy, thereby increasing efficiency. Conventional PV devices without a diffuser and a reflective layer may not be able to recapture photons that reach the back side of the device without being absorbed initially by the absorber layer.

Figure 13:
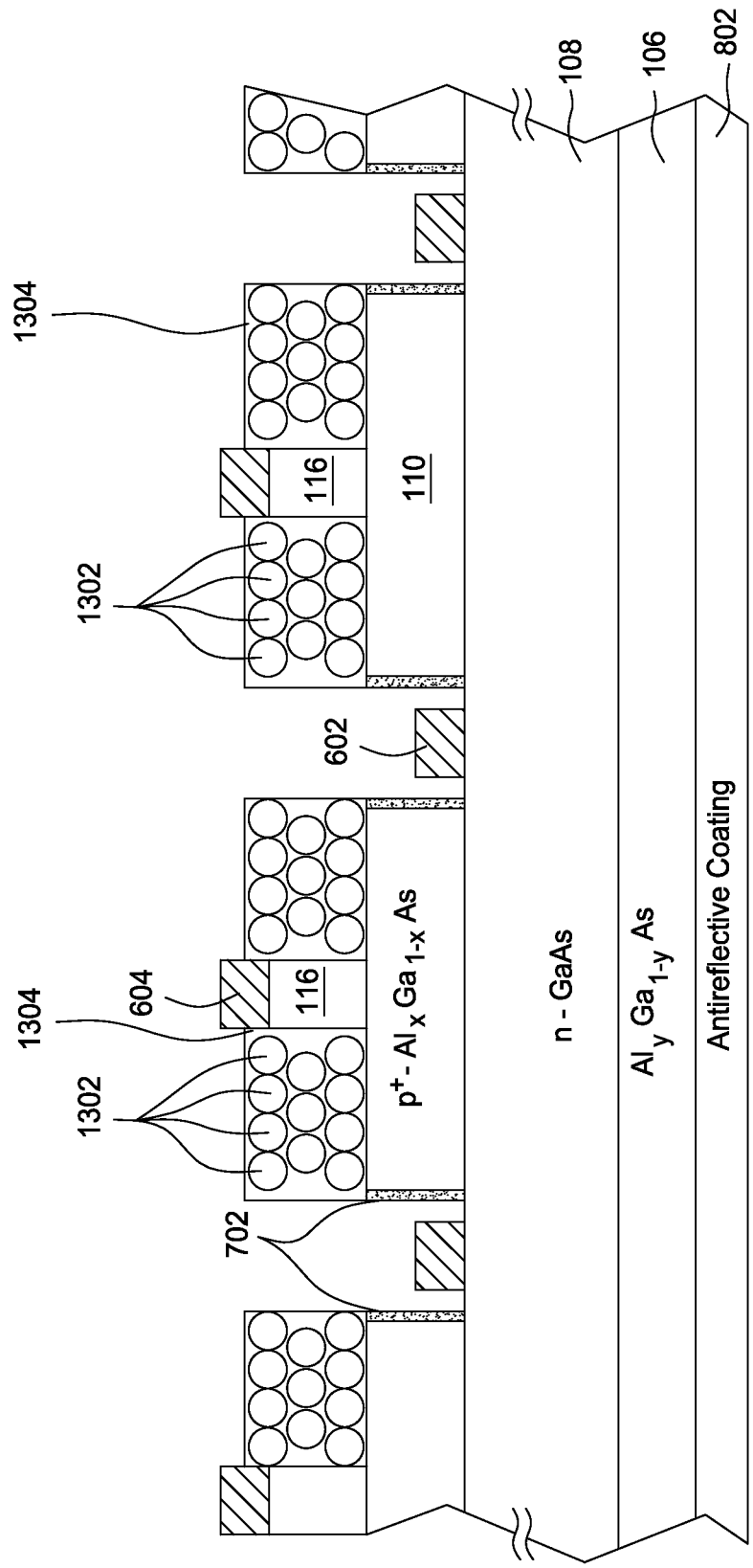
FIG. 13 illustrates dielectric particles and white paint functioning as the diffuser of FIG. 12, in accordance with an embodiment of the present invention.

For some embodiments, the diffuser 1202 may comprise dielectric particles 1302, as illustrated in FIG. 13. The dielectric particles may comprise any suitable material which is electrically insulative and does not absorb light. The dielectric particles 1302 may have a diameter in range from about 0.2 to 2.0 µm. The dielectric particles 1302 may be covered by white paint 1304, which reflects light and may act as the reflective layer for redirecting photons back to the interior of the PV unit 100. The white paint 1304 may comprise $TiO_2$, for example.

Figure 14:
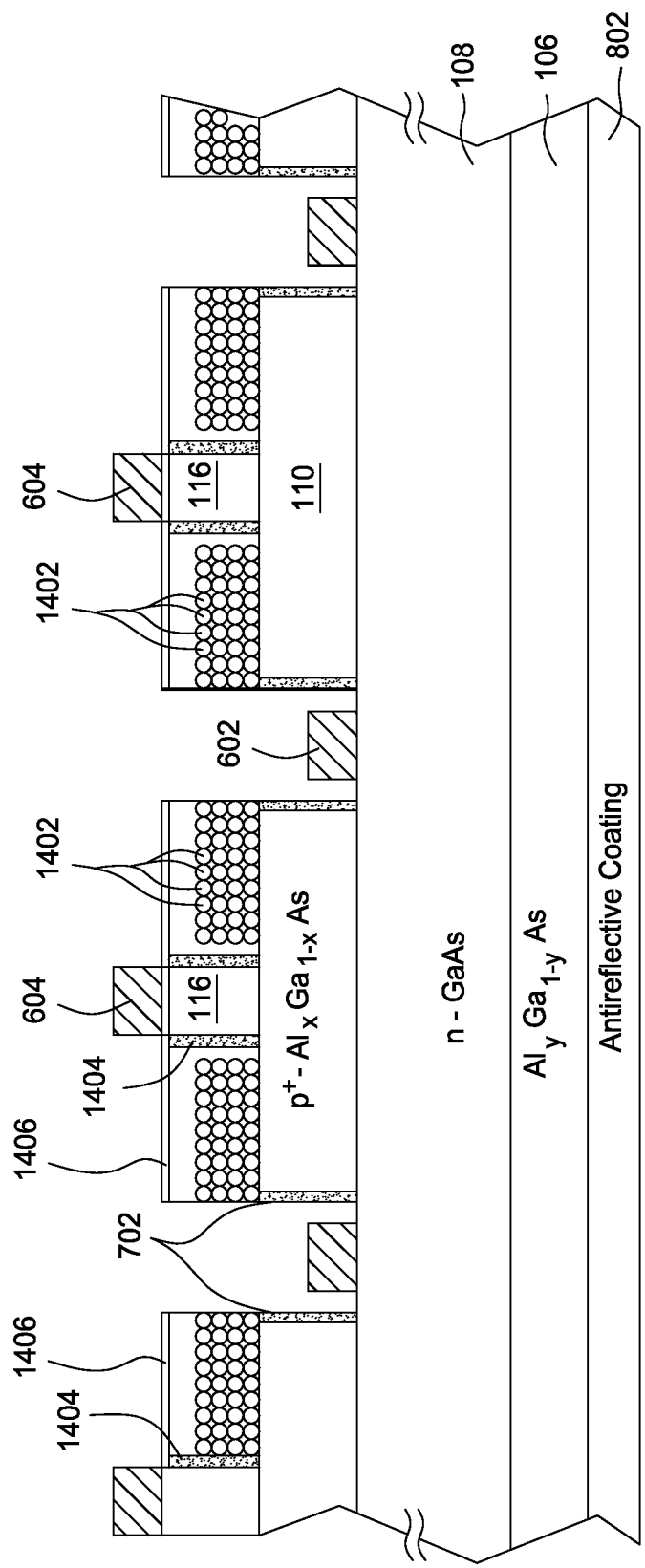
FIG. 14 illustrates metal particles functioning as the diffuser of FIG. 12, in accordance with an embodiment of the present invention.

For some embodiments, the diffuser 1202 may comprise metal particles 1402, as illustrated in FIG. 14. The metal particles 1402 may reflect photons that were not absorbed by the absorber layer, and by having a multitude of metal particles 1402, the photons may be scattered in different directions several times before being redirected to the interior of the PV unit 100. The metal particles 1402 may have a diameter of about 150 to 200 nm, functioning as relatively compact scatterers. With thinner particles in the diffuser 1202, the thickness of the PV unit 100 may be kept smaller, thereby maintaining the desired flexibility of the PV unit 100.

Because the metal particles 1402 are electrically conductive, lateral surfaces of the interface layer 116 may be passivated to prevent the metal particles 1402 from interfering with the operation of the device. The interface layer 116 may be passivated using any suitable passivation method, such as chemical vapor deposition (CVD) or plasma-enhanced CVD (PECVD). The passivation 1404 may comprise any suitable electrically non-conductive material, such as silicon nitride (SiN), $SiO_x$, $TiO_x$, $TaO_x$, zinc sulfide (ZnS), or any combination thereof. Furthermore, for some embodiments, a dielectric layer 1406 may be formed above the metal particles 1402 in an effort to avoid shunting the contacts 602, 604, as depicted in FIG. 14. The dielectric layer 1406 may comprise any suitable electrically insulative material, such as $SiO_2$, SiN, or glass.

Exemplary Integration

Figure 15A:
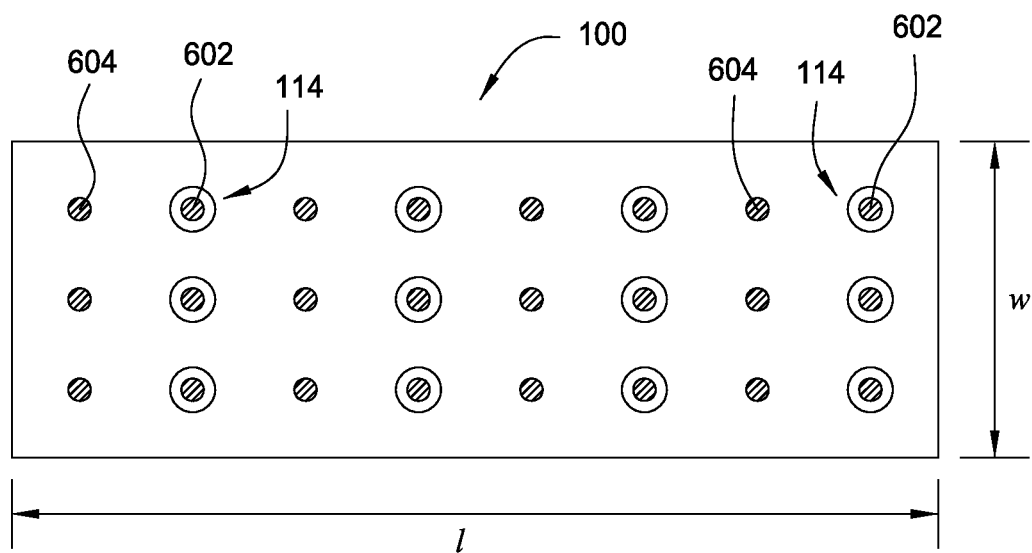
FIG. 15A illustrates the back side of the PV unit, in accordance with an embodiment of the present invention.

FIG. 15A illustrates the back side of the PV unit 100, wherein all the contacts 602, 604 are disposed on the back side. As described above, the n-contacts 602 may be located within the recesses 114 in the emitter layer 110. The PV unit 100 may have a width w of about 2 to 3 cm and a length/of about 10 cm.

Figure 15B:
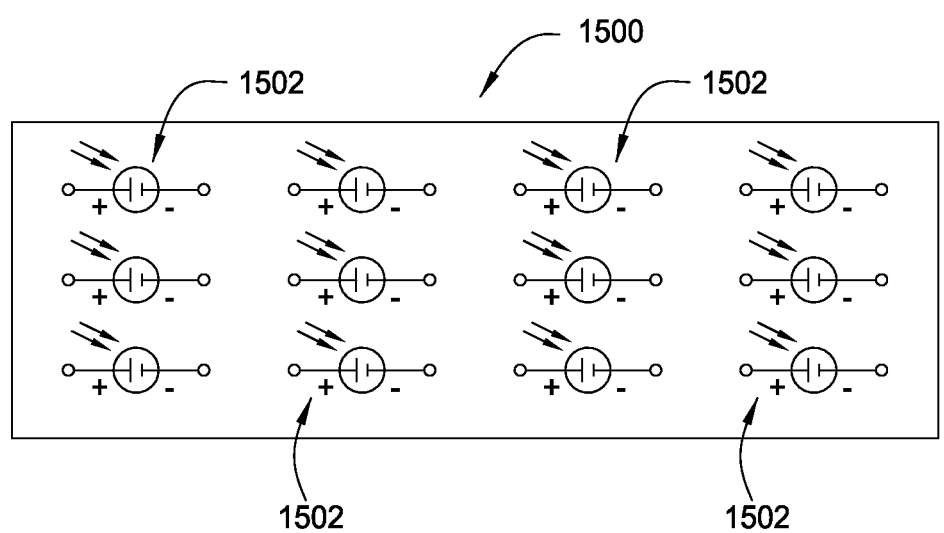
FIG. 15B illustrates an equivalent electrical circuit of the PV unit of FIG. 15A, in accordance with an embodiment of the present invention.

FIG. 15B illustrates an equivalent electrical circuit 1500 of the PV unit 100 of FIG. 15A. One may consider the PV unit 100 as having an efficient miniature solar cell 1502 between each n-contact 602 and p-contact 604. Within a PV unit 100, all of the n-contacts 602 are coupled to the same base layer 108 and all of the p-contacts 604 are coupled to the same emitter layer 110. Therefore, the open circuit voltage ($V_{oc}$) of the equivalent circuit 1500 may be modeled as the sum of the open circuit voltages across the miniature solar cells 1502 in series, and the short circuit current ($I_{sc}$) may be modeled as the sum of the short circuit currents across the miniature solar cells 1502 in parallel. In essence, the equivalent electrical circuit 1500 of the PV unit 100 may be thought of as a single solar cell with a greater $V_{oc}$ and a larger $I_{sc}$ than those of the miniature solar cells 1502 which compose it.

Figure 16:
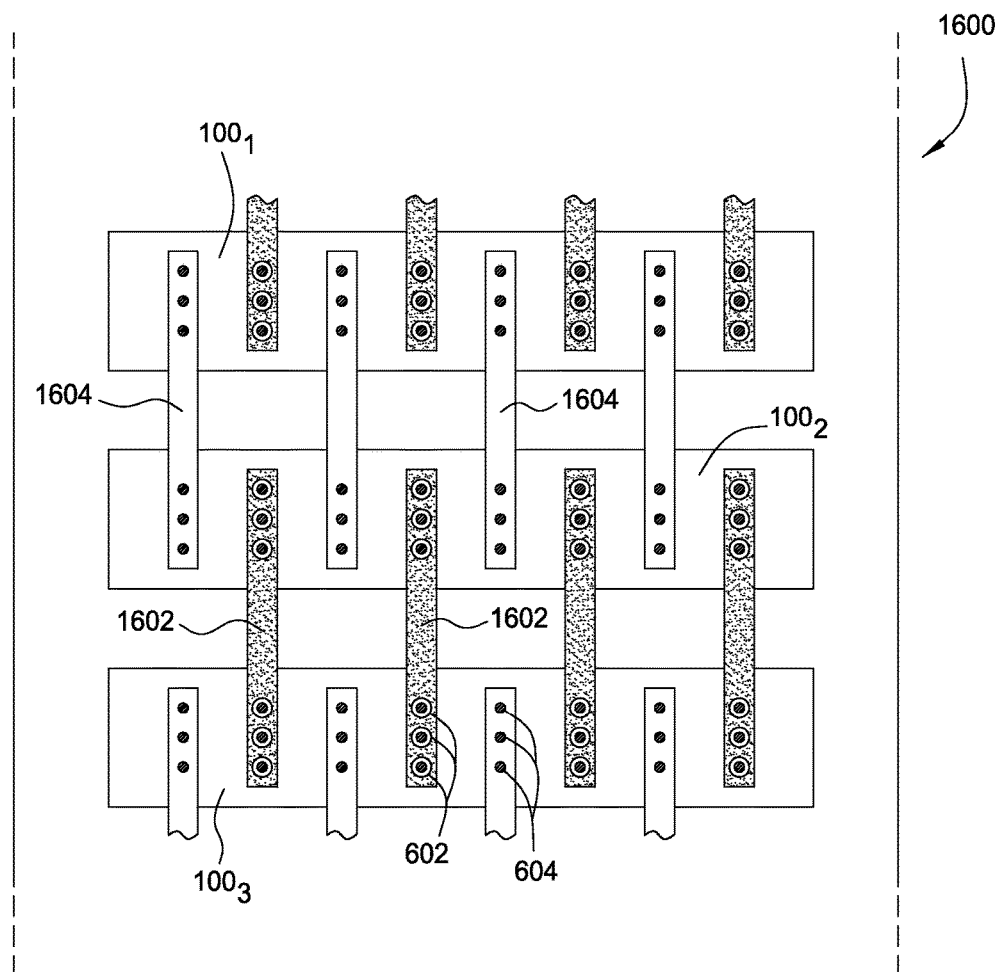
FIG. 16 illustrates the interconnection of the p-contacts and of the n-contacts between the multiple PV units to form a PV bank, in accordance with an embodiment of the present invention.

FIG. 16 illustrates the interconnection of the p-contacts 604 and of the n-contacts between multiple PV units 100 to form a PV bank 1600, in accordance with an embodiment of the present invention. For some embodiments, a PV bank 1600 may comprise one column of about ten PV units 100 arranged in parallel. In this manner, the short circuit current ($I_{sc}$) of the PV bank 1600 may be about ten times greater than that of a single PV unit 100.

The interconnection may be accomplished by thin strips 1602, 1604 placed between the PV units 100 according to a certain pattern. For example, strips 1604 may connect the p-contacts 604 of a first PV unit $100_1$ to the p-contacts 604 of a second PV unit $100_2$. Rather than connecting the first PV unit $100_1$ to the second PV unit $100_2$ for the n-contacts, strips 1602 may connect the n-contacts 602 of the second PV unit $100_2$ to the n-contacts 602 of a third PV unit $100_3$ as illustrated in FIG. 16. This interconnection pattern may be selected to provide considerable flexibility in the PV bank 1600.

The strips 1602, 1604 may comprise any suitable electrically conductive material, such as metal or metal alloys. For example, the strips 1602, 1604 may comprise tin-coated copper. For some embodiments, the strips 1602 for the n-contacts may comprise a different material than the strips 1604 for the p-contacts 604. To form strips made of metal or metal alloys, the strips may be applied to the back side of the PV units 100 across the "dot geometry" of the contacts 602, 604 via screen printing, for example.

Screen printing metals or metal alloys may indicate a high process temperature. Therefore, for some embodiments, the strips 1602, 1604 may comprise an electrically conductive polymer instead of a metal or metal alloy. The conductive polymer strips may be formed by screen printing at a lower temperature than that suggested by silk-screening metal.

The spacing between adjacent PV units 100 may be about 1 to 2 mm on the PV bank 1600. This relatively close spacing may also allow for greater flexibility in the PV bank 1600, especially when combined with an interconnection pattern selected for this purpose, such as the interconnection pattern described above.

Figure 17:
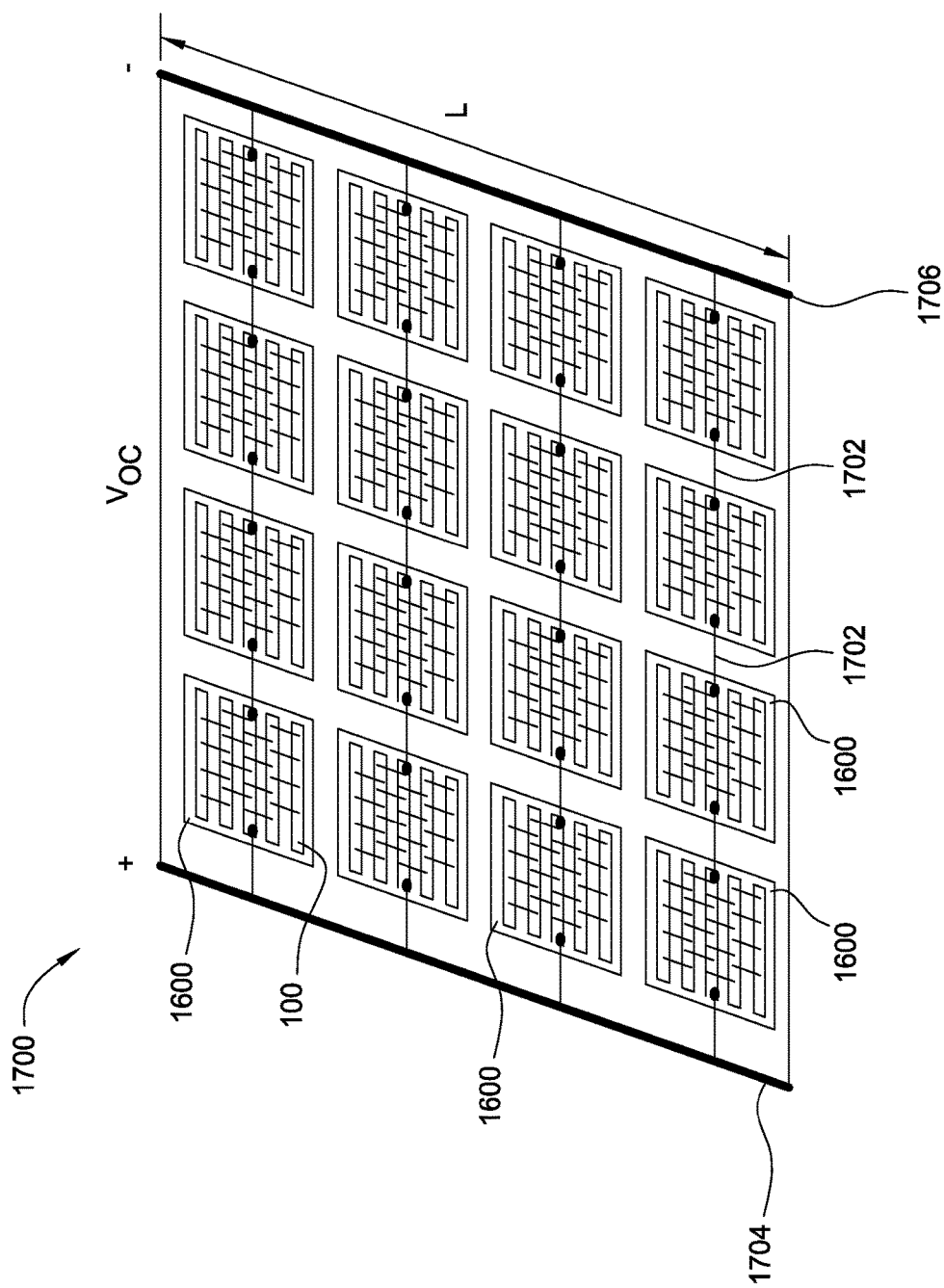
FIG. 17 illustrates the interconnection of multiple PV banks to form a PV module, in accordance with an embodiment of the present invention.

FIG. 17 illustrates the interconnection of multiple PV banks 1600 arranged in an array to form a PV module 1700, in accordance with an embodiment of the present invention. Adjacent PV banks 1600 in a row may be connected together by couplings 1702. The couplings 1702 may connect the n-contact 602 of one PV bank to the p-contact 604 of an adjacent PV bank within the row, such that the PV banks 1600 (and the equivalent electric circuit) of a row are connected in series, thereby combining the open circuit voltage ($V_{oc}$) capabilities of the PV banks 1600. The couplings 1702 may comprise a wire or a strip of metal, metal alloy, or a conductive polymer, similar to the strips 1602, 1604 in the PV banks 1600.

The couplings 1702 may also connect a p-contact 604 on each row of PV banks 1600 to a p-side bus-bar 1704 on one side and connect an n-contact 602 on each row of PV banks 1600 to an n-side bus-bar 1706 on the other side of the PV module 1700. In this manner, the rows of series-connected PV banks 1600 may be connected in parallel, thereby combining the short circuit current ($I_{sc}$) capabilities of the PV banks 1600. The bus-bars 1704, 1706 may be relatively thick in an effort to carry substantial current generated by the PV banks 1600 to a load (not shown). For some embodiments, the DC output voltage ($V_{oc}$) of the module 1700 may be coupled to an inverter in an effort to create AC voltage.

The finished PV module 1700 may be encapsulated. The front side of the PV module 1700 may be covered with a thin transparent sheet comprising glass or plastic, for example. The length L of the module may be about 1 m with a 4×4 array of PV banks 1600 as illustrated in FIG. 16.

By connecting the PV units 100 with the strips 1602, 1604 to form PV banks 1600 and by integrating the PV banks 1600 with couplings 1702 to develop the PV module 1700, the PV module 1700 may have a built-in tolerance against local defects. In other words, a defect (e.g., a shunt between an n-contact 602 and a p-contact 604) localized to a PV unit 100 need not cause the module 1700 to fail. Furthermore, protection may be added at the macroscopic and/or the microscopic level. In other words, protection, such as fuses, may be added to one or more PV banks 1600 and/or to the PV module 1700. For some embodiments, protection circuitry may be built into the PV units 100 at the wafer level.

While the foregoing is directed to embodiments of the invention, other and further embodiments of the invention may be devised without departing from the basic scope thereof, and the scope thereof is determined by the claims that follow.

The invention claimed is:

1. A photovoltaic (PV) device comprising:
 a base layer having a first portion and a second portion, wherein the first portion and the second portion of the base layer are made of a material including a compound semiconductor material having an n-type doping;
 an emitter layer located closer than the base layer to a first side of the device and having a p-type doping, wherein the second portion of the base layer is located closer than the first portion of the base layer to the emitter layer;
 a reflector layer configured to redirect photons towards the emitter layer and the base layer, wherein the emitter layer is disposed between the base layer and the reflector layer; and
 a p-n junction formed between the emitter layer and the base layer, the p-n junction causing a voltage to be generated in the PV device in response to the PV device being exposed to a light source at a second side of the PV device,
 wherein the emitter layer is made of one material including a compound semiconductor material and that compound semiconductor material has a compound that is different than a compound of the compound semiconductor material of the material of the first portion of the base layer by at least one element, such that a heterojunction is formed between the emitter layer and the first portion of the base layer,
 wherein the emitter layer is of higher band gap energy than the first portion of the base layer;
 wherein the second portion of the base layer provides a gradual transition in composition that is limited to a region between the composition of the material of the first portion of the base layer nearest to the emitter layer and the composition of the material of the emitter layer nearest to the first portion of the base layer, and
 wherein composition of the first portion of the base layer is constant.

2. The PV device of claim 1, wherein the second portion of the base layer provides an offset between the p-n junction and the heterojunction.

3. The PV device of claim 1, wherein recesses are formed through the emitter layer and partly through the base layer, allowing for electrical contact to both the emitter and base layers from the same side of the device.

4. The PV device of claim 1, wherein the compound semiconductor material of the material of the base layer is a group III-V compound semiconductor material.

5. The PV device of claim 4, wherein the compound semiconductor material of the material of the first portion of the base layer is gallium arsenide (GaAs).

6. The PV device of claim 4, wherein the compound semiconductor material of the material of the first portion of the base layer is indium gallium phosphide (InGaP).

7. The PV device of claim 1, wherein the compound semiconductor material of the material of the emitter layer is a group III-V compound semiconductor material.

8. The PV device of claim 7, wherein the compound semiconductor material of the material of the emitter layer is aluminum gallium arsenide (AlGaAs).

9. The PV device of claim 7, wherein the compound semiconductor material of the material of the emitter layer is aluminum gallium indium phosphide (AlGaInP).

10. The PV device of claim 1, wherein the reflector layer is metallic.

11. The PV device of claim 1, wherein the reflector layer also provides electrical connection to the device.

12. The PV device of claim 1, wherein a dielectric layer is located between the emitter layer and the reflector layer.

13. The PV device of claim 1, further comprising a diffuser layer located between the base layer and the reflector layer, wherein the diffuser layer scatters light at multiple angles for improved light trapping.

14. A photovoltaic (PV) device comprising:
 a base layer made of a material including a compound semiconductor material having an n-type doping;
 an emitter layer located closer than the base layer to a first side of the device and having a p-type doping;
 a reflector layer configured to redirect photons towards the emitter layer and the base layer, wherein the emitter layer is disposed between the base layer and the reflector layer; and
 a p-n junction formed between the emitter layer and the base layer, the p-n junction causing a voltage to be generated in the PV device in response to the PV device being exposed to a light source at a second side of the PV device,
 wherein the emitter layer is made of one material including a compound semiconductor material and that compound semiconductor material has a compound that is different than a compound of the compound semiconductor material of the material of the base layer by at least one element, such that a heterojunction is formed between the emitter layer and the base layer,
 wherein the emitter layer is of higher band gap energy than the base layer and there is a gradual transition in composition that is limited to a region between the composition of the material of the base layer nearest the emitter layer and the composition of the material of the emitter layer nearest the base layer.

15. The PV device of claim 14, wherein the base layer further comprises a first portion and a second portion, and wherein the second portion of the base layer is located closer than the first portion of the base layer to the emitter layer.

16. The PV device of claim 15, wherein the second portion of the base layer provides an offset between the p-n junction and the heterojunction.

17. The PV device of claim 15, wherein the second portion of the base layer provides a gradual transition in composition from the composition of the first portion of the base layer to the composition of the emitter layer and wherein composition of the first portion of the base layer is constant.

18. The PV device of claim 14, wherein recesses are formed through the emitter layer and partly through the base layer, allowing for electrical contact to both the emitter and base layers from the same side of the device.

19. The PV device of claim 14, wherein the compound semiconductor material of the material of the base layer is a group III-V compound semiconductor material.

20. The PV device of claim 19, wherein the compound semiconductor material of the material of the base layer is gallium arsenide (GaAs).

21. The PV device of claim 15, wherein the compound semiconductor material of the material of the first portion of the base layer is gallium arsenide (GaAs).

22. The PV device of claim 19, wherein the compound semiconductor material of the material of the base layer is indium gallium phosphide (InGaP).

23. The PV device of claim 15, wherein the compound semiconductor material of the material of the first portion of the base layer is indium gallium phosphide (InGaP).

24. The PV device of claim 14, wherein the compound semiconductor material of the material of the emitter layer is a group III-V compound semiconductor material.

25. The PV device of claim 24, wherein the compound semiconductor material of the material of the emitter layer is aluminum gallium arsenide (AlGaAs).

26. The PV device of claim 24, wherein the compound semiconductor material of the material of the emitter layer is aluminum gallium indium phosphide (AlGaInP).

27. The PV device of claim 14, wherein the reflector layer is metallic.

28. The PV device of claim 14, wherein the reflector also provides electrical connection to the device.

29. The PV device of claim 14, wherein a dielectric layer is located between the emitter layer and the reflector layer.

30. The PV device of claim 14, further comprising a diffuser layer located between the base layer and the reflector layer, wherein the diffuser layer scatters light at multiple angles for improved light trapping.

* * * * *